(12) United States Patent
Hill et al.

(10) Patent No.: US 11,512,948 B2
(45) Date of Patent: Nov. 29, 2022

(54) IMAGING SYSTEM FOR BURIED METROLOGY TARGETS

(71) Applicant: KLA Corporation, Milpitas, CA (US)

(72) Inventors: Andrew V. Hill, Berkeley, CA (US); Gilad Laredo, Haifa (IL); Amnon Manassen, Haifa (IL); Avner Safrani, Misgav (IL)

(73) Assignee: KLA Corporation, Milpitas, CA (US)

( * ) Notice: Subject to any disclaimer, the term of this patent is extended or adjusted under 35 U.S.C. 154(b) by 99 days.

(21) Appl. No.: 17/069,177

(22) Filed: Oct. 13, 2020

(65) Prior Publication Data

US 2021/0372784 A1    Dec. 2, 2021

Related U.S. Application Data

(60) Provisional application No. 63/029,741, filed on May 26, 2020.

(51) Int. Cl.
*G01B 11/27* (2006.01)

(52) U.S. Cl.
CPC ........ *G01B 11/272* (2013.01); *G01B 2210/56* (2013.01)

(58) Field of Classification Search
CPC ............................ G01B 11/272; G01B 2210/56
USPC ........................................................ 356/508
See application file for complete search history.

(56) References Cited

U.S. PATENT DOCUMENTS

| 5,608,526 A | 3/1997 | Piwonka-Corle et al. |
| 5,859,424 A | 1/1999 | Norton et al. |
| 6,429,943 B1 | 8/2002 | Opsal et al. |
| 7,478,019 B2 | 1/2009 | Zangooie et al. |
| 7,933,026 B2 | 4/2011 | Opsal et al. |
| 10,401,738 B2 | 9/2019 | Hill et al. |
| 10,444,639 B2 | 10/2019 | Demirer et al. |

(Continued)

FOREIGN PATENT DOCUMENTS

| JP | 6452749 B2 * | 1/2019 | ........... G01B 11/065 |
| WO | 2008094753 A2 | 8/2008 | |
| WO | 2018069052 A1 | 4/2018 | |

OTHER PUBLICATIONS

PCT International Search Report and Written Opinion for International Application No. PCT/US2021/033805 dated Sep. 8, 2021, 8 pages.

*Primary Examiner* — Tarifur R Chowdhury
*Assistant Examiner* — Omar H Nixon
(74) *Attorney, Agent, or Firm* — Suiter Swantz pc llo

(57) ABSTRACT

A metrology system may include an imaging sub-system to image a metrology target buried in a sample, where the sample is formed from bonded first and second substrates with a metrology target at the interface. The metrology system may further include an illumination sub-system with an illumination field stop and an illumination pupil, where the illumination field stop includes an aperture to provide that a projected size of the field-stop aperture on a measurement plane corresponding to the metrology target matches a field of view of the detector at the measurement plane, and where the illumination pupil includes a central obscuration to provide oblique illumination of the metrology target with angles greater than a cutoff angle selected to prevent illumination from the illumination source from reflecting off of the bottom surface of the sample and through the field of view of the detector at the measurement plane.

52 Claims, 23 Drawing Sheets

(56) References Cited

U.S. PATENT DOCUMENTS

| | | | |
|---|---|---|---|
| 11,309,202 B2 * | 4/2022 | Krishnan | H01L 21/681 |
| 2002/0135781 A1 * | 9/2002 | Singh | G01N 21/4738 |
| | | | 356/601 |
| 2005/0099678 A1 * | 5/2005 | Wang | G02B 5/208 |
| | | | 359/359 |
| 2016/0334326 A1 * | 11/2016 | Sapiens | G01B 11/24 |
| 2018/0173839 A1 | 6/2018 | Fang et al. | |

* cited by examiner

700 ⟶

702 — ILLUMINATING A BURIED METROLOGY TARGET, WHERE THE ILLUMINATION ON THE TARGET IS TAILORED USING A FIELD-STOP APERTURE SUCH THAT A PROJECTED SIZE OF THE FIELD-STOP APERTURE ON A MEASUREMENT PLANE CORRESPONDING TO THE METROLOGY TARGET MATCHES A FIELD OF VIEW OF AN IMAGING DETECTOR AT THE MEASUREMENT PLANE, WHERE THE ILLUMINATION IS FURTHER TAILORED USING AN ILLUMINATION PUPIL WITH A CENTRAL OBSCURATION TO BLOCK ILLUMINATION AT ANGLES BELOW A CUTOFF ANGLE, THE CUTOFF ANGLE SELECTED TO PREVENT ILLUMINATION FROM REFLECTING OFF OF THE BOTTOM SURFACE OF THE SAMPLE AND PROPAGATING THROUGH THE FIELD OF VIEW OF THE IMAGING DETECTOR

704 — GENERATING ONE OR MORE IMAGES OF THE METROLOGY TARGET ON THE IMAGING DETECTOR

706 — GENERATING ONE OR MORE METROLOGY MEASUREMENTS OF THE SAMPLE BASED ON THE ONE OR MORE IMAGES

FIG.7

IMAGING SYSTEM FOR BURIED METROLOGY TARGETS

CROSS-REFERENCE TO RELATED APPLICATION

The present application claims the benefit under 35 U.S.C. § 119(e) of U.S. Provisional Application Ser. No. 63/029,741 filed May 26, 2020, which is incorporated herein by reference in the entirety.

TECHNICAL FIELD

The present disclosure relates to image-based metrology and, more particularly, to imaging metrology targets buried in a sample.

BACKGROUND

Ever-increasing demands on the physical density of semiconductor devices have led to increasingly complex three-dimensional designs. One approach to achieving three-dimensional designs is to fabricate structures on two separate wafers and bond them together with the structures near the interface. This technique may facilitate the integration of complex structures since the two wafers may be fabricated separately and bonded in a subsequent process. However, it may be desirable to measure and/or control the relative alignment, or overlay, of the two wafers.

SUMMARY

A metrology system is disclosed in accordance with one or more illustrative embodiments of the present disclosure. In one illustrative embodiment, the metrology system includes an imaging sub-system to image a metrology target buried in a sample on a detector based on light collected from an objective lens. In another illustrative embodiment, the sample is formed from a first substrate and a second substrate bonded to the first substrate at an interface, the sample further including a metrology target located at the interface, and where the metrology target includes a first target structure on the first substrate and a second target structure on the second substrate. In another illustrative embodiment, the metrology system includes an illumination sub-system. In another illustrative embodiment, the illumination sub-system includes an illumination source. In another illustrative embodiment, the illumination sub-system includes one or more illumination optics to illuminate the metrology target with illumination from the illumination source through the objective lens. In another illustrative embodiment, the illumination sub-system includes an illumination field stop located at a field plane conjugate to the metrology target, where the illumination field stop includes a field-stop aperture. In another illustrative embodiment, at least one of a size or shape of the field-stop aperture is selected to provide that a projected size of the field-stop aperture on a measurement plane corresponding to the metrology target matches a field of view of the detector at the measurement plane. In another illustrative embodiment, the illumination sub-system includes an illumination pupil located at a pupil plane, where the illumination pupil includes a central obscuration in a center of the pupil plane. In another illustrative embodiment, at least one of a size or shape of the central obscuration is selected to provide oblique illumination of the metrology target with angles greater than a cutoff angle. In another illustrative embodiment, the cutoff angle is selected, based on at least one of a size of the field of view of the detector at the measurement plane, a thickness of the first substrate, or a thickness of the second substrate, to prevent reflections of the illumination from the illumination source off of at least one of a top surface or a bottom surface of the sample from reaching the detector. In another illustrative embodiment, the metrology system includes a controller communicatively coupled to the detector. In another illustrative embodiment, the controller receives one or more images of the metrology target from the sample. In another illustrative embodiment, the controller generates one or more metrology measurements of the sample based on the one or more images.

A metrology system is disclosed in accordance with one or more illustrative embodiments of the present disclosure. In one illustrative embodiment, the metrology system includes an imaging sub-system to image a metrology target buried in a sample on a detector based on light collected from an objective lens. In another illustrative embodiment, the sample is formed from a first substrate and a second substrate bonded to the first substrate at an interface, the sample further including a metrology target located at the interface, and where the metrology target includes a first target structure on the first substrate and a second target structure on the second substrate. In another illustrative embodiment, the metrology system includes a sample positioning sub-system including a translation stage to position the metrology target at a measurement plane of the detector. In another illustrative embodiment, the metrology system includes an illumination sub-system. In another illustrative embodiment, the illumination sub-system includes an illumination source. In another illustrative embodiment, the illumination sub-system includes one or more illumination optics to illuminate the metrology target with illumination from the illumination source through the objective lens. In another illustrative embodiment, the illumination sub-system includes a pupil stop located at a pupil plane, where the pupil stop includes a central obscuration in a center of the pupil plane. In another illustrative embodiment, at least one of a size or shape of the central obscuration is selected to provide oblique illumination of the metrology target with angles greater than a cutoff angle. In another illustrative embodiment, the cutoff angle is selected, based on at least one of a size of a field of view of the detector at the measurement plane, a thickness of the first substrate, or a thickness of the second substrate, to prevent reflections of the illumination from the illumination source off of at least one of a top surface or a bottom surface of the sample from reaching the detector. In another illustrative embodiment, the metrology system includes a controller communicatively coupled to the detector. In another illustrative embodiment, the controller receives one or more images of the metrology target from the sample. In another illustrative embodiment, the controller generates one or more metrology measurements of the sample based on the one or more images.

A metrology system is disclosed in accordance with one or more illustrative embodiments of the present disclosure. In one illustrative embodiment, the metrology system includes an imaging sub-system to image a metrology target buried in a sample on a detector based on light collected from an objective lens. In another illustrative embodiment, the sample is formed from a first substrate and a second substrate bonded to the first substrate at an interface, the sample further including a metrology target located at the interface, and where the metrology target includes a first target structure on the first substrate and a second target structure on the second substrate. In another illustrative embodiment, the metrology system includes a sample positioning sub-system including a translation stage to position the metrology target at a measurement plane of the detector. In another illustrative embodiment, the metrology system includes an illumination sub-system. In another illustrative embodiment, the illumination sub-system includes an illumination source. In another illustrative embodiment, the illumination sub-system includes one or more illumination optics to illuminate the metrology target with illumination from the illumination source through the objective lens. In another illustrative embodiment, the illumination sub-system includes an illumination field stop located at a field plane conjugate to the metrology target, where the illumination field stop includes a field-stop aperture. In another illustrative embodiment, at least one of a size or shape of the field-stop aperture is selected to provide that a projected size of the field-stop aperture on a measurement plane corresponding to the metrology target matches a field of view of the detector at the measurement plane. In another illustrative embodiment, the metrology system includes a controller communicatively coupled to the detector. In another illustrative embodiment, the controller receives one or more images of the metrology target from the sample. In another illustrative embodiment, the controller generates one or more metrology measurements of the sample based on the one or more images.

A method is disclosed in accordance with one or more illustrative embodiments of the present disclosure. In one illustrative embodiment, the method includes illuminating a metrology target on a sample with an illumination sub-system. In another illustrative embodiment, the sample is formed from a first substrate and a second substrate bonded to the first substrate at an interface, the sample further including a metrology target located at the interface, and where the metrology target includes a first target structure on the first substrate and a second target structure on the second substrate. In another illustrative embodiment, the illumination sub-system includes an illumination source. In another illustrative embodiment, the illumination sub-system includes one or more illumination optics to illuminate the metrology target with illumination from the illumination source. In another illustrative embodiment, the illumination sub-system includes an illumination field stop located at a field plane conjugate to the metrology target, where the illumination field stop includes a field-stop aperture. In another illustrative embodiment, at least one of a size or shape of the field-stop aperture is selected to provide that a projected size of the field-stop aperture on a measurement plane corresponding to the metrology target matches a field of view of the detector at the measurement plane. In another illustrative embodiment, the illumination sub-system includes an illumination pupil located at a pupil plane, where the illumination pupil includes a central obscuration in a center of the pupil plane. In another illustrative embodiment, at least one of a size or shape of the central obscuration is selected to provide oblique illumination of the metrology target with angles greater than a cutoff angle. In another illustrative embodiment, the cutoff angle is selected, based on at least one of a size of the field of view of the detector at the measurement plane, a thickness of the first substrate, or a thickness of the second substrate, to prevent reflections of the illumination from the illumination source off of at least one of a top surface or a bottom surface of the sample from reaching the detector. In another illustrative embodiment, the method includes generating one or more images of the metrology target on the imaging detector. In another illustrative embodiment, the method includes generating one or more metrology measurements of the sample based on the one or more images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 7 is a flow diagram illustrating steps performed in a method for metrology on a buried metrology target, in accordance with one or more embodiments of the present disclosure.

DETAILED DESCRIPTION

Figure 1A:
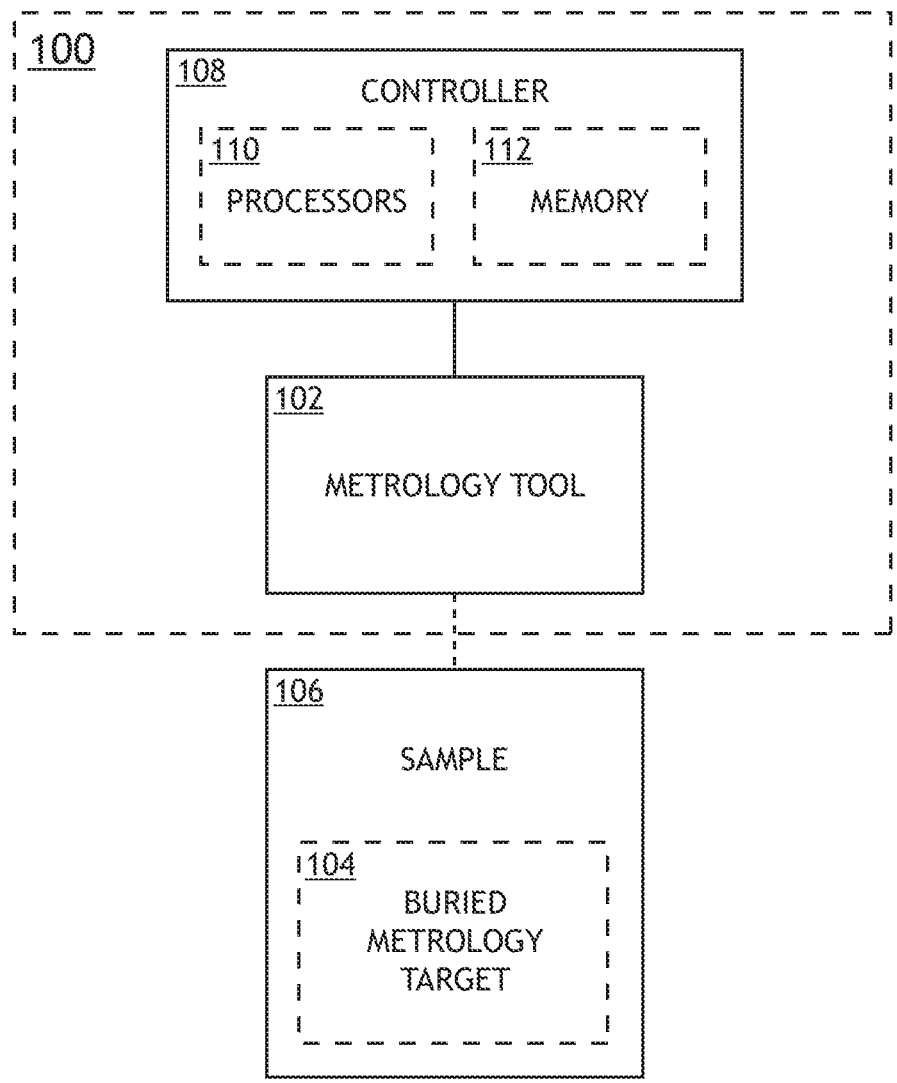
FIG. 1A is a conceptual view illustrating a metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to metrology based on a metrology target buried within a sample. For example, a bonded sample may include two substrates (e.g., wafers), at least one having patterned features on one or more layers, where the patterned portions of the substrates are bonded to form a unified sample. In this configuration, the patterned features may be proximate to the interface and buried within the sample. This fabrication technique may be suitable for, but is not limited to, the fabrication of complex three-dimensional memory structures.

It is contemplated herein that it is generally desirable to perform metrology by capturing light reflected from the metrology target and that light from other sources may introduce noise that may negatively impact the measurement. For example, metrology systems may typically generate one or more images of a metrology target that may include, but are not limited to, a field-plane image of metrology target features or a pupil-plane image of an angular distribution of light from the target. The image quality (e.g., the image contrast, the signal to noise ratio (SNR), or the like) of any such image may be negatively impacted by spurious reflections.

It is further contemplated herein that metrology based on buried metrology targets may present several challenges. For example, light must typically travel through at least a portion of the sample for a measurement. Accordingly, absorption of light by the sample may limit the available wavelengths that may be used and may further reduce the intensity of collected light. Additionally, reflections of the illuminating light from various surfaces other than the buried metrology target itself may degrade the metrology measurement. For example, a measurement of a metrology target located at an interface between two substrates of a bonded sample may be negatively impacted by spurious reflections such as, but not limited to, reflections from a top surface of the bonded sample, reflections from portions of the interface outside the metrology target, or reflections from the bottom surface of the bonded sample.

Embodiments of the present disclosure are directed to systems and methods for performing metrology on buried metrology targets using tailored illumination designed to limit the collection of light reflected from surfaces other than a buried metrology target of interest. In this regard, the quality of a measurement of a buried metrology target may be enhanced (e.g., relative to traditional illumination techniques) by limiting the capture of spurious reflections associated with the particular geometry of the sample. For example, the spatial and angular profile of illumination of the buried metrology target may be tailored to limit the capture of spurious reflections and thus provide that an image is generated primarily, if not entirely, by light reflected by the metrology target of interest.

In some embodiments, a metrology tool includes an illumination sub-system to illuminate a buried metrology target with tailored illumination and a collection sub-system including an imaging detector having a known sensor size and a known magnification such that a field of view of the detector at the plane of the metrology target (e.g., the imaging plane) is known. Further, in some embodiments, the illumination sub-system may include a field stop having an aperture arranged to limit a spatial extent of illuminated light to a size and/or shape of the detector field of view at the plane of the metrology target (e.g., a measurement plane). In this regard, reflections from sample depths other than the plane of the metrology target (e.g., the top and bottom surfaces of the sample, intermediate layers of the sample, or the like) may be mitigated.

It is contemplated herein that light incident on a buried metrology target at normal incidence or near normal incidence may propagate through a field of view of a detector, reflect from the bottom surface of the sample, propagate back through the field of view of the detector, and be collected by the collection sub-system. Further, this light would not be influenced by an illumination field stop sized to match a detector field of view. In some embodiments, the illumination sub-system includes an aperture stop having a central obscuration sized to block this near-normal light. For example, the size and shape of the central obscuration of the illumination aperture stop may be based on both the thickness of the sample below the buried metrology target as well as the size and shape of the field of view as defined by an illumination field stop if present or the detector. Since an illumination aperture stop may generally reduce the amount of light provided by an illumination source, adjusting the size and shape of the pupil obscuration based on these known parameters may allow for precise tailoring of the illumination profile to mitigate spurious reflections while limiting any negative impacts of reducing light intensity used for a measurement.

It is further contemplated herein that alignment (or misalignment) of a buried metrology target within a metrology system may impact the quality of an image of the buried metrology target and the sensitivity or accuracy of any associated metrology measurements. Additionally, the alignment (or misalignment) of the buried metrology target within the metrology system may impact the efficacy of illumination field or aperture stops in mitigating spurious reflections. Additional embodiments of the present disclosure are directed to systems and methods for aligning a buried metrology target within a metrology system (e.g., focusing on a buried metrology target).

It is further contemplated herein that the systems and methods disclosed herein may be applicable to any type of metrology tool known in the art. For example, systems and methods disclosed herein may be applicable to image-based metrology tools in which one or more field-plane images of a buried metrology target are generated. By way of another example, systems and methods disclosed herein may be applicable to scatterometry metrology tools in which one or more pupil-plane images are generated.

Systems and methods disclosed herein may further be applicable to any type of metrology measurement known in the art. For example, systems and methods disclosed herein may be suitable for overlay metrology of bonded samples to measure the relative alignment (or misalignment) of the constituent substrates. In this example, an overlay metrology target for measuring overlay associated with relative alignment (or misalignment) of two substrates of a bonded sample may be formed at the interface between the two bonded substrates, where the overlay metrology target includes structures on one or more layers of each of the two substrates. Accordingly, a measurement of the overlay target may involve transmitting illumination through a top substrate and collecting light reflected from the overlay metrology target that propagates back through the top substrate. By way of another example, systems and methods disclosed herein may provide for process-related metrology based on process-sensitive metrology targets located on one or more layers of a sample that are partially or fully covered by additional sample layers. Such process-related metrology targets may have features that are sensitive to one or more parameters associated with a fabrication step such as, but not limited to, intensity and/or dose of light during lithographic exposure, a focal position of a sample during a process step, or the like.

It is further contemplated herein that providing tailored illumination through the use of an illumination field stop and/or an illumination pupil stop may enable the mitigation of spurious reflections while not limiting the collection of light from the sample. In this regard, a metrology tool may utilize any type of imaging technique known in the art. For example, it is recognized herein that various metrology techniques based on metrology targets with periodic structures may be designed to generate metrology data based only on selected diffraction orders of light from the metrology targets. Accordingly, the use of tailored illumination as disclosed herein may be suitable for any such technique.

As used throughout the present disclosure, the term "sample" or "substrate" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable.

Referring now to FIGS. 1A through 7, systems and methods for imaging buried metrology targets are described in greater detail in accordance with one or more embodiments of the present disclosure.

FIG. 1A is a conceptual view illustrating a metrology system 100, in accordance with one or more embodiments of the present disclosure. In one embodiment, the system 100 includes a metrology tool 102 configured to generate at least one image of at least one buried metrology target 104 in a sample 106. For example, the metrology tool 102 may generate one or more field-plane images of the buried metrology target 104 and/or one or more pupil-plane images of the buried metrology target 104.

The sample 106 may include any type of sample known in the art having a buried metrology target 104. For example, the sample 106 may include a bonded sample formed from two substrates bonded together at an interface, where the buried metrology target 104 is located at or near the interface. Further, the substrates may be formed from any material or combination of materials including, but not limited to, a semiconductor, a metal, a polymer, a glass, or a crystalline material. In one embodiment, at least one of the substrates includes a wafer (e.g., a semiconductor wafer). For example, a sample 106 may be formed as a bonded wafer sample with two wafers bonded at an interface.

The metrology tool 102 may include any type of metrology tool known in the art suitable for generating one or more images of one or more buried metrology targets 104 on a sample 106 at any plane or combination of planes and measuring one or more parameters of interest associated with the sample 106 based on the one or more images.

In another embodiment, the system 100 includes a controller 108 communicatively coupled to the metrology tool 102. In another embodiment, the controller 108 includes one or more processors 110 configured to execute program instructions maintained on a memory device 112, or memory. The one or more processors 110 of a controller 108 may include any processing element known in the art. In this sense, the one or more processors 110 may include any microprocessor-type device configured to execute algorithms and/or instructions. Further, the memory device 112 may include any storage medium known in the art suitable for storing program instructions executable by the associated one or more processors 110. For example, the memory device 112 may include a non-transitory memory medium. As an additional example, the memory device 112 may include, but is not limited to, a read-only memory (ROM), a random-access memory (RAM), a magnetic or optical memory device (e.g., disk), a magnetic tape, a solid-state drive and the like. It is further noted that memory device 112 may be housed in a common controller housing with the one or more processors 110.

In this regard, the one or more processors 110 of the controller 108 may execute any of the various process steps described throughout the present disclosure. For example, the one or more processors 110 of the controller 108 may receive one or more images of the buried metrology target 104 (e.g., one or more field-plane images or pupil-plane images) from a detector and generate one or more metrology measurements for the sample 106 based on the one or more images from the detector.

Figure 1B:
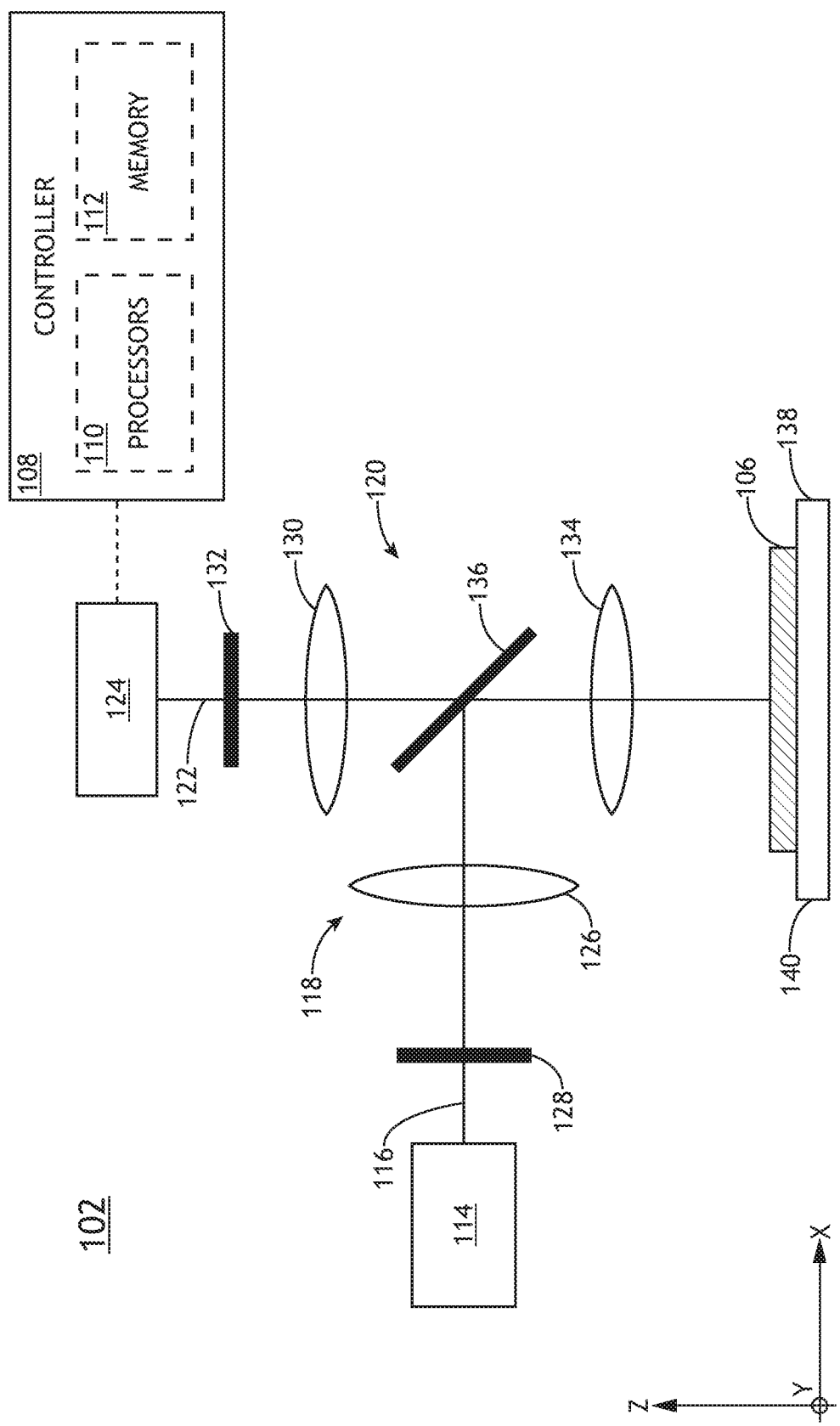
FIG. 1B is a conceptual view of an image-based metrology tool in accordance with one or more embodiments of the present disclosure.

FIG. 1B is a conceptual view of an image-based metrology tool 102 in accordance with one or more embodiments of the present disclosure.

In one embodiment, the metrology tool 102 includes an illumination source 114 configured to generate illumination 116. In another embodiment, the system 100 includes an illumination pathway 118 (e.g., an illumination sub-system) including one or more components to direct the illumination 116 to the sample 106.

In another embodiment, the metrology tool 102 includes a collection pathway 120 (e.g., an imaging sub-system) including one or more components to collect light from the sample, referred to herein as sample light 122. The sample light 122 may include any type of radiation emanating from the sample 106 including, but not limited to, light or particles. For example, the sample light 122 may include portions of the illumination 116 reflected and/or scattered by the sample 106. By way of another example, the sample light 122 may include luminescence induced by absorption of the illumination 116 by the sample 106. By way of another example, the sample light 122 may include particles from the sample 106 in response to the illumination 116 such as, but not limited to, backscattered electrons or secondary electrons.

In another embodiment, the metrology tool 102 includes at least one detector 124 configured to capture at least a portion of the sample light 122 from the collection pathway 120.

The illumination source 114 may include any type of light source known in the art. In one embodiment, the illumination source 114 includes one or more coherent sources such as, but not limited to, one or more laser sources. In this regard, the illumination source 114 may produce an illumination 116 having high coherence (e.g., high spatial coherence and/or temporal coherence). For example, the illumination source 114 may include one or more broadband lasers such as, but not limited to, one or more supercontinuum lasers or white-light lasers. By way of another example, the illumination source 114 may include one or more narrow-band lasers. By way of a further example, the illumination source 114 may include one or more tunable lasers to provide an illumination 116 having tunable spectral intensity. Further, a coherent illumination source 114 may be based on any type of technology or product design. For example, the illumination source 114 may include, but is not limited to, any combination of one or more fiber lasers, one or more diode lasers, or one or more gas lasers.

In another embodiment, the illumination source 114 includes one or more low-coherence sources to provide an illumination 116 having low or partial coherence (e.g., spatial and/or temporal coherence). For example, the illumination source 114 may include one or more light emitting diodes (LEDs) or super-luminescence LEDs. By way of another example, the illumination source 114 may include a laser-sustained plasma (LSP) source such as, but not limited to, an LSP lamp, an LSP bulb, or an LSP chamber suitable for containing one or more elements that, when excited by a laser source into a plasma state, may emit broadband illumination. By way of another example, the illumination source 114 may include a lamp source such as, but not limited to, an arc lamp, a discharge lamp, an electrode-less lamp, or the like.

Further, the illumination source 114 may include any combination of light sources. In one embodiment, the illumination source 114 includes one or more supercontinuum laser sources to provide broadband illumination and one or more partially-coherent high-brightness LEDs to supplement gaps in the spectrum of the one or more supercontinuum laser sources.

The illumination source 114 may provide illumination 116 having any selected wavelength or range of wavelengths (e.g., spectrum). It is contemplated herein that the spectrum of the illumination 116 may be selected to transmit through at least a portion of the sample 106 to reach the buried metrology target 104 with minimal or at least acceptable absorption. For example, in the case of a sample 106 formed as two bonded semiconductor substrates, the spectrum of the illumination 116 may be selected to include wavelengths in the infrared spectral range. However, it is to be understood that the systems and methods disclosed herein may be broadly applicable to a wide range of samples such that the illumination 116 may have any selected spectrum based on the composition of the sample 106.

The illumination source 114 may further provide light having any selected temporal characteristics. In one embodiment, the illumination source 114 includes one or more continuous-wave sources to provide a continuous-wave illumination 116. In another embodiment, the illumination source 114 includes one or more pulsed sources to provide a pulsed or otherwise modulated illumination 116. For example, the illumination source 114 may include one or more mode-locked lasers, one or more Q-switched lasers, or the like.

In one embodiment, the illumination pathway 118 includes one or more illumination lenses 126 to direct the illumination 116 from the illumination source 114 to the sample 106. Additionally, the illumination lenses 126 may be arranged to relay one or more field planes or pupil planes to locations within the illumination pathway 118. The illumination pathway 118 may further include one or more illumination conditioning components 128 suitable for modifying and/or conditioning the illumination 116. The illumination conditioning components 128 may be, but are not required to be, located at field planes and/or pupil planes in the illumination pathway 118. For example, the one or more illumination conditioning components 128 may include, but are not limited to, an illumination aperture stop, an illumination field stop, one or more polarizers, one or more compensators, one or more filters, one or more beam splitters, one or more diffusers, one or more homogenizers, one or more apodizers, one or more beam shapers, one or more mirrors, or one or more lenses.

In one embodiment, the collection pathway 120 includes one or more collection lenses 130 to direct the sample light 122 from the sample 106 to the detector 124. In another embodiment, the collection pathway 120 includes one or more collection conditioning components 132 suitable for modifying and/or conditioning the sample light 122. For example, the one or more collection conditioning components 132 may include, but are not limited to, one or more polarizers, one or more filters, one or more beam splitters, one or more diffusers, one or more apodizers, or one or more beam shapers.

In one embodiment, the metrology tool 102 includes a measurement objective lens 134 to direct illumination 116 to the sample 106 and/or capture the sample light 122 from the sample 106. For example, as illustrated in FIG. 1B, the metrology tool 102 may include a beamsplitter 136 common to both the illumination pathway 118 and the collection pathway 120 to allow the measurement objective lens 134 to simultaneously direct illumination 116 to the sample 106 and capture the sample light 122 from the sample 106. In another embodiment, though not shown, the illumination pathway 118 and the collection pathway 120 may include separate lenses to direct the illumination 116 to the sample 106 and collect the sample light 122, respectively.

The detector 124 may include any optical detector known in the art suitable for capturing sample light 122 received from the sample 106. Further, the detector 124 may be suitable for capturing images of a sample 106 that is either stationary or moving. For example, a detector 124 may include, but is not limited to, a photodiode array (PDA), a charge-coupled device (CCD), a complementary metal-oxide semiconductor (CMOS) device, a time-delay integration (TDI) detector, a line-scan detector, a photomultiplier tube (PMT), an avalanche photodiode (APD), or the like. In another embodiment, a detector 124 may include a spectroscopic detector suitable for identifying wavelengths of radiation emanating from the sample 106 and dispersed onto a sensor using a dispersive element.

Further, the system 100 may include multiple detectors 124 (e.g. associated with multiple beam paths generated by one or more beamsplitters to facilitate multiple metrology measurements (e.g. multiple metrology tools) by the system 100. In another embodiment, a detector 124 may include a spectroscopic detector suitable for identifying wavelengths of radiation emanating from the sample 106.

A detector 124 may further be located at any imaging plane of the system 100. For instance, a detector 124 may be located at a plane conjugate to the sample 106 to generate an image of the sample 106. In another instance, a detector 124 may be located at a pupil plane (or a conjugate thereof) to generate a pupil image.

In another embodiment, the metrology tool 102 includes a detector 124 configured to capture light emanating from the sample 106 (e.g., sample light 122) through the collection pathway 120. For example, a detector 124 may receive radiation reflected or scattered (e.g., via specular reflection, diffuse reflection, and the like) from the sample 106. By way of another example, a detector 124 may receive radiation generated by the sample 106 (e.g., luminescence associated with absorption of the illumination 116, and the like). By way of another example, a detector 124 may receive one or more diffracted orders of radiation from the sample 106 (e.g., 0-order diffraction, ±1-order diffraction, ±2-order diffraction, and the like).

For measurement techniques involving the collection of spectral data (e.g., spectroscopic reflectometry, spectroscopic ellipsometry, or the like), it may be desirable to generate continuous spectral data over a spectral range of interest. For example, the metrology tool 102 may include a dispersive element (e.g., a prism, a grating, or the like) to spatially disperse light from the overlay target onto one or more detectors 124 to capture a spectral measurement. However, it is recognized herein that the sensitivity of a particular detector 124 may vary as a function of wavelength. Accordingly, the detector 124 may require calibration to account for the variations of sensitivity as a function of wavelength.

In another embodiment, the metrology tool 102 may include multiple detectors 124 to facilitate multiple metrology measurements by the metrology tool 102. In this regard, the metrology tool 102 depicted in FIG. 1B may perform multiple simultaneous metrology measurements.

In one embodiment, the metrology tool 102 includes a sample positioning sub-system 138 configured to adjust the sample 106 and/or the illumination 116 prior, during, and/or after a measurement. For example, FIG. 1B illustrates a sample positioning sub-system 138 that includes a translation stage 140 to adjust the position of the sample 106 along any dimension such as, but not limited to, a lateral position within the X-Y plane, axially along the Z axis (e.g., an optical axis of the measurement objective lens 134), tip, tilt, or the like. By way of another example, though not shown, the sample positioning sub-system 138 may include one or more scanning optical elements (e.g., galvanometers, rotatable mirrors, or the like) suitable for scanning the illumination 116 across the sample 106, or a portion thereof.

In one embodiment, the sample positioning sub-system 138 includes one or more components to detect and/or monitor the location of the sample 106, the buried metrology target 104, or any selected layer within the sample 106 along the optical axis of the measurement objective lens 134). In this regard, the sample positioning sub-system 138 may accurately align the buried metrology target 104 within the metrology tool 102. It is contemplated herein that accurate alignment of the buried metrology target 104 within the system 100 may provide numerous benefits. For example, accurate alignment of the buried metrology target 104 may facilitate accurate control of the spatial and angular profile of the illumination 116 from the illumination source 114 on the buried metrology target 104 through the use of tailored illumination field stops and/or pupil stops as discussed throughout the present disclosure. By way of another example, accurate alignment of the buried metrology target 104 may facilitate accurate alignment of the buried metrology target 104 with the detector 124 to provide quality images of the selected plane (e.g., the field plane or the pupil plane).

The sample positioning sub-system 138 may detect and/or monitor the axial location of the sample 106 or any portion thereof using a variety of techniques.

In one embodiment, the sample positioning sub-system 138 includes a Linnik interferometer to determine and/or monitor a position of the buried metrology target 104 along the optical axis of the measurement objective lens 134. For example, the Linnik interferometer may be configured to operate with the spectrum of the illumination 116 from the illumination source 114 which may be, but is not required to be, narrow-band (e.g., having a bandwidth of approximately 5 nm or less).

Figure 1C:
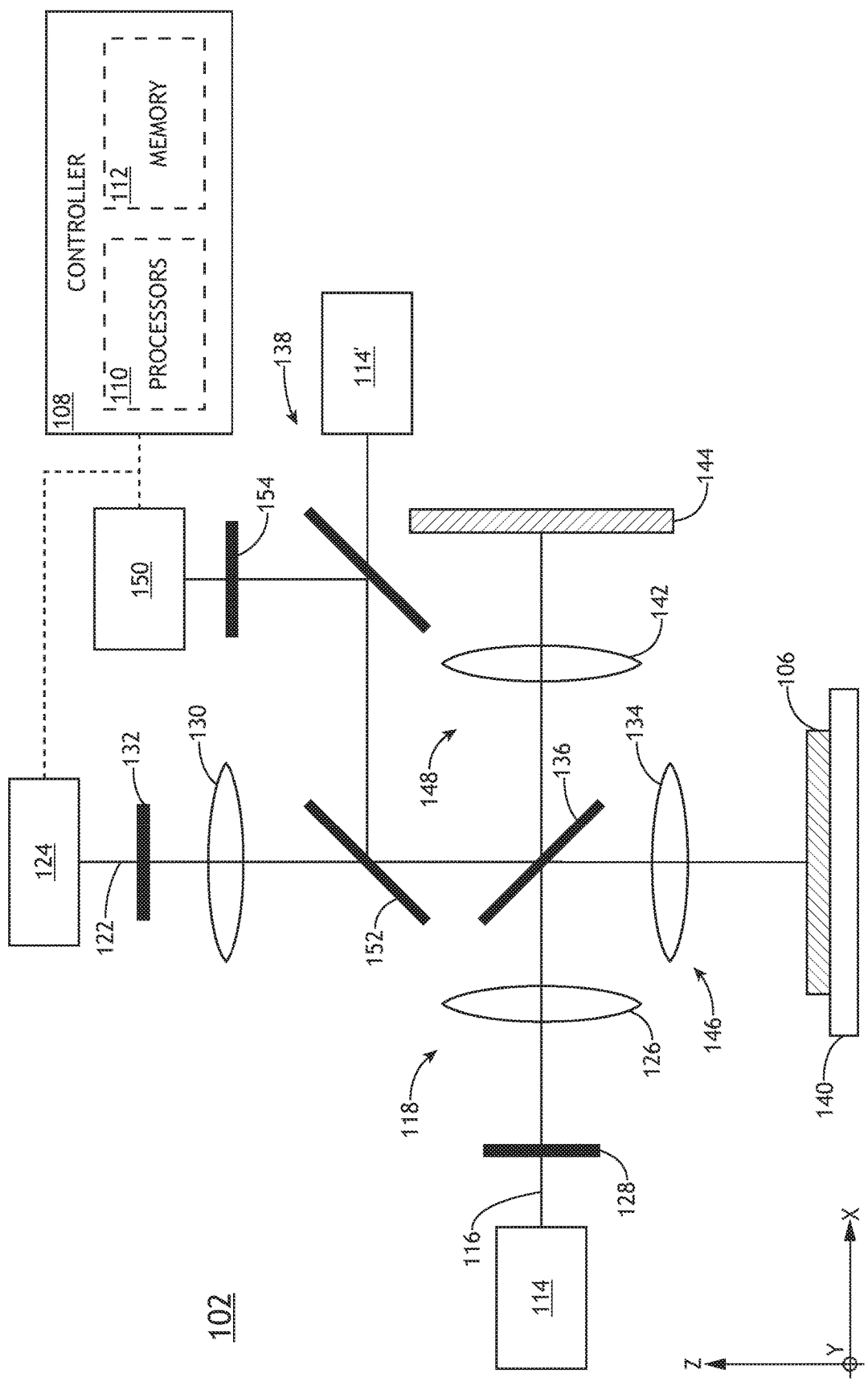
FIG. 1C is a schematic view of a metrology tool including a sample positioning sub-system based on a Linnik interferometer, in accordance with one or more embodiments of the present disclosure.

FIG. 1C is a schematic view of a metrology tool 102 including a sample positioning sub-system 138 based on a Linnik interferometer, in accordance with one or more embodiments of the present disclosure.

In one embodiment, the metrology tool 102 includes a reference objective lens 142 configured to receive a portion of the illumination 116 through the beamsplitter 136, direct this portion of the illumination 116 to a reference sample 144, and collect light reflected from this reference sample 144. In this regard, the measurement objective lens 134 and the sample 106 may form a measurement arm 146 of a Linnik interferometer, and the reference objective lens 142 and the reference sample 144 may form a reference arm 148 of the Linnik interferometer.

The reference sample 144 may include any sample suitable for providing reference light in the Linnik interferometer. For example, the reference sample 144 may be designed to at least partially replicate the sample 106. In this regard, the Linnik interferometer may be balanced and the optical properties of light propagating through the reference sample 144 may be the same as or substantially similar to those of light propagating through the sample 106.

In one embodiment, the reference sample 144 may be formed from two bonded substrates having the same or similar refractive indices as the sample 106. Further, the reference sample 144 may, but is not required to, include a reflecting layer or coating (e.g., a metallic coating, or the like) at the interface of the two bonded substrates to increase the reflectivity of the interface. In another embodiment, if the sample 106 includes one or more intermediate layers proximate to or forming the buried metrology target 104, the reference sample 144 may include the same or similar layers.

In another embodiment, the reference sample 144 is formed as a single substrate, where the bottom surface forms a reference surface. Further, this reference surface may, but is not required to, include a reflecting layer or coating (e.g., a metallic coating, or the like) to increase the reflectivity of the reference surface. Additionally, it is to be understood that the reference sample 144, or any portion thereof, may have any selected thickness based on the application and the properties of the sample 106. For example, in the case of a sample 106 formed from one or more bonded semiconductor wafers, a reference sample 144 may be formed from one or more semiconductor wafers (e.g., a silicon wafer) having a thickness of the top wafer of the sample 106 (e.g., 775 μm, 750 μm, 600 μm, 300 μm, 100 μm, or the like).

In another embodiment, the reference sample 144 includes patterned features at one or more locations (e.g., a back surface of a single reference substrate or an interface between bonded substrates) to facilitate alignment of the reference sample 144.

In one embodiment, the metrology tool 102 includes a photodiode 150 to generate an image of an interference pattern associated with interference between light in the measurement arm 146 and the reference arm 148 of the Linnik interferometer. In one embodiment, as illustrated in FIG. 1C, the metrology tool 102 includes an additional beamsplitter 152 to provide continuous interference images. In another embodiment, the metrology tool 102 may include a translatable mirror (e.g., a flip mirror, a mirror on a translation stage, or the like) to selectively direct light to the photodiode 150 for the generation of interference images. For instance, the metrology tool 102 may direct all light from the beamsplitter 136 to the photodiode 150 when adjusting the position of the sample 106 prior to a measurement to maximize the signal available for focus detection and may then direct all light from the beamsplitter 136 to the detector 124 used for metrology measurements (e.g., capturing one or more sample images) during a measurement. Additionally, the metrology tool 102 may include a shutter or other beam deflector to selectively block the light in the reference arm 148 during a metrology measurement.

It is contemplated herein that the illumination requirements for metrology and sample positioning may differ. Accordingly, the metrology tool 102 may include any combination of illumination sources and optical elements to provide light having selected properties for both metrology and sample positioning measurements. For example, the metrology tool 102 may include a beam diffuser or other components suitable for reducing the spatial coherence of light used for sample positioning to mitigate speckle during the measurement.

In one embodiment, as illustrated in FIG. 1C, the metrology tool 102 includes a common illumination source 114 for metrology measurements and sample positioning. In this configuration, the metrology tool 102 may include one or more optical elements such as, but not limited to, a spectral filter, a spatial filter, a speckle reducer (e.g., a diffuser, or the like), a field stop, a pupil stop, or a polarizer to modify the properties of the illumination 116 from the common illumination source 114 for sample positioning measurements. These optical elements may be placed at any suitable location including, but not limited to, the illumination pathway 118 to modify light incident on the sample 106 and/or in the collection pathway 120 to modify light collected from the sample 106.

For example, FIG. 1C illustrates a spectral filter 154 to modify the spectrum of the illumination 116 incident on the photodiode 150 during a sample positioning measurement. For instance, the spectral filter 154 may narrow the bandwidth of the illumination 116 used for a sample positioning measurement to a selected bandwidth such as, but not limited to, 10 nm, 5 nm, 2 nm, 1 nm, or any selected bandwidth. In this regard, the illumination 116 used during a sample positioning measurement may be monochromatic or quasi monochromatic. It is to be understood that although FIG. 1C illustrates the placement of the spectral filter 154 just prior to the photodiode 150, it is to be understood that the spectral filter 154 may be placed at any suitable location including, but not limited to, the illumination pathway 118.

In another embodiment, though not shown, the metrology tool 102 includes a separate illumination source 114' for sample positioning and for metrology. For example, as illustrated in FIG. 1C, the separate illumination source 114' for sample positioning may be integrated into the sample positioning sub-system 138. For instance, the sample positioning sub-system 138 may utilize the additional beamsplitter 152 illustrated in FIG. 1C to direct light from the separate illumination source 114' to the sample 106. By way of another example, though not shown, the illumination pathway 118 may include a beamsplitter or other beam selector to provide selective illumination of the sample 106 from any of two or more illumination sources.

It is further contemplated herein that the geometry of a buried metrology target 104 in a sample 106 may provide challenges for typical interferometric sample positioning techniques including, but not limited to, Linnik interferometry. For example, propagation of light through the sample 106 (and the reference sample 144) may introduce chromatic dispersion or spherical aberration that may negatively impact the sample positioning measurement.

The metrology tool 102 may utilize any spatial or angular profile of light in a sample positioning measurement. In one embodiment, the metrology tool 102 provides oblique illumination (e.g., annular illumination, dipole illumination, quadrupole illumination, or the like) for sample positioning measurements. For example, the metrology tool 102 may include, but is not required to include, a central obscuration in an illumination pupil of the illumination pathway 118 to generate annular illumination with a selected range of angles (e.g., numerical apertures) on the sample 106 and reference sample 144.

Figure 1D:
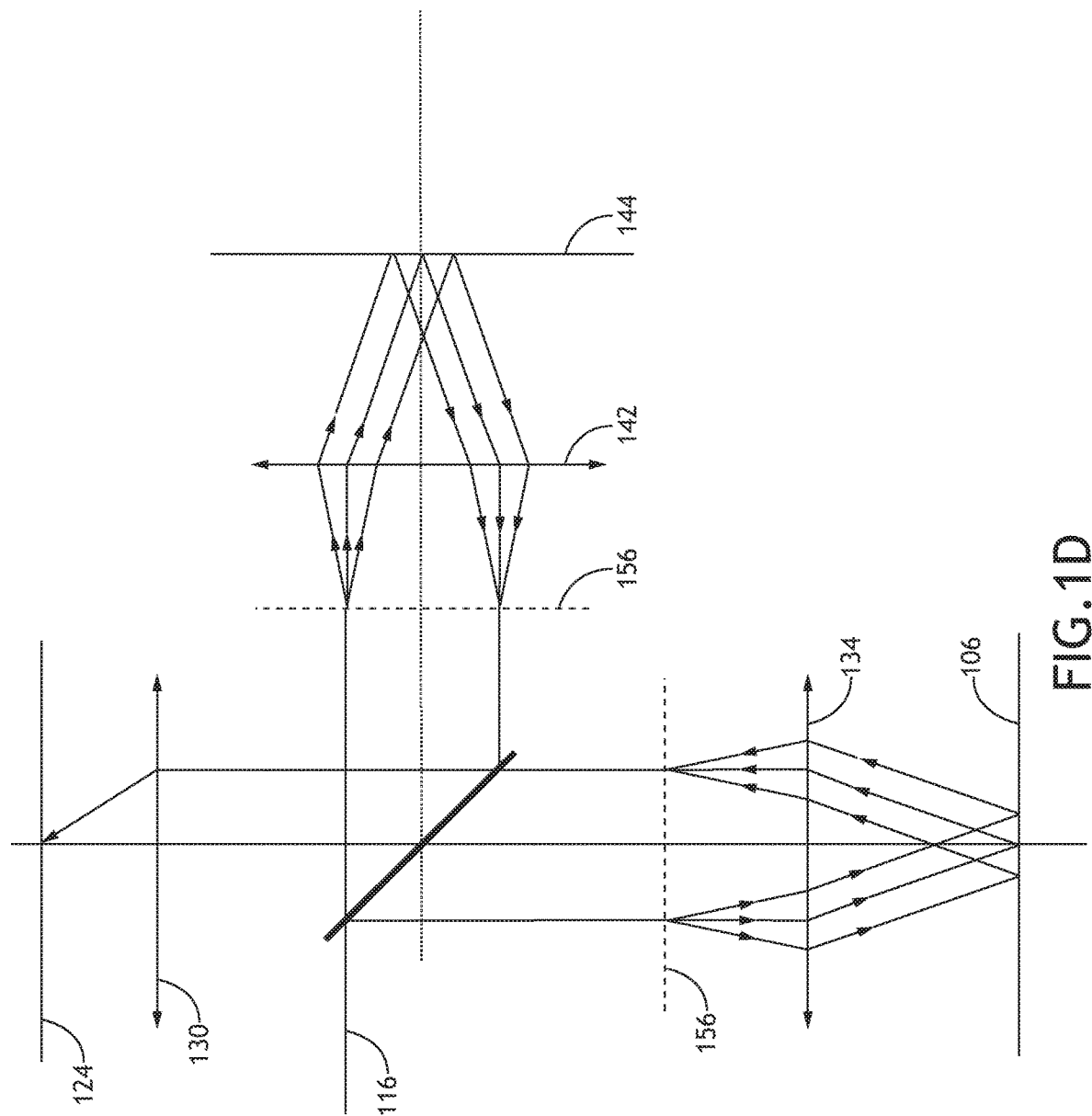
FIG. 1D is a schematic ray diagram illustrating the propagation of oblique illumination through the metrology tool in accordance with one or more embodiments of the present disclosure.

FIG. 1D is a schematic ray diagram illustrating the propagation of oblique illumination through the metrology tool 102 in accordance with one or more embodiments of the present disclosure. For example, FIG. 1D may illustrate the propagation of illumination 116 from a single point along an annular profile. Further, it is to be understood that FIG. 1D is not intended to be a strict ray diagram and that the illustration of three rays from the pupil planes 156 is provided solely for illustrative purposes to indicate illumination of the sample 106 and reference sample 144 across a spatial field of view.

Figure 1F:
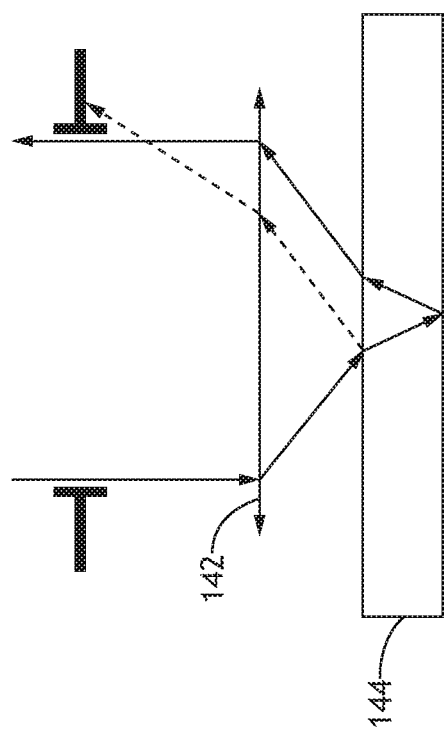
FIG. 1F is a schematic ray diagram of annular illumination incident on the reference sample in accordance with one or more embodiments of the present disclosure.
Figure 1E:
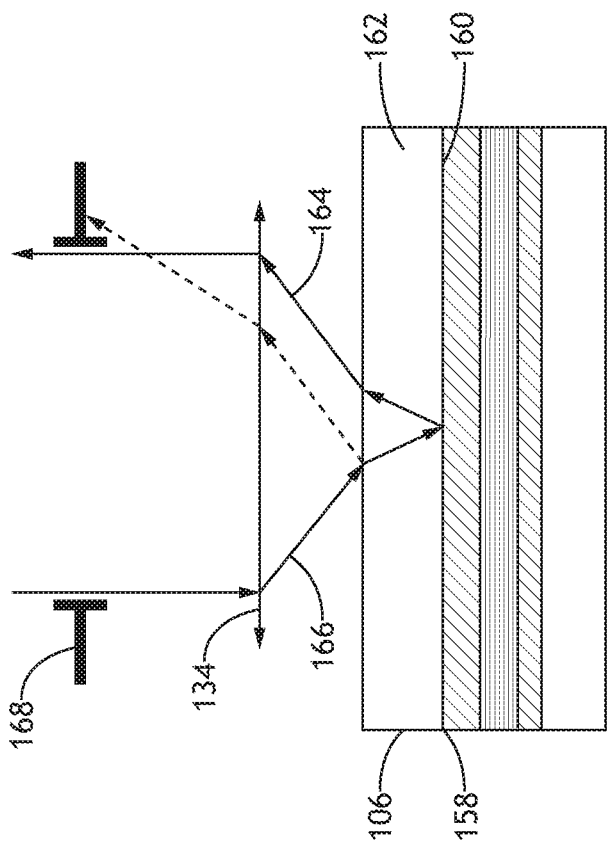
FIG. 1E is a schematic ray diagram of annular illumination incident on the sample in accordance with one or more embodiments of the present disclosure.

It is contemplated herein that oblique illumination, and particularly high-angle or high NA illumination, may facilitate sensitive and accurate sample positioning measurements using Linnik interferometry. For example, reflections from a top surface of the sample 106 (and the top surface of the reference sample 144) may impact signals associated with reflections from the buried metrology target 104 at the depth of interest in the sample 106. To mitigate this, the illumination 116 may designed to have an annular or other high NA profile during a sample positioning measurement to avoid the collection of specular reflection from the top surfaces of the sample 106 and reference sample 144. Referring now to FIGS. 1E and 1F, the use of annular illumination to suppress reflections from the top surfaces of the sample 106 and the reference sample 144 are illustrated in greater detail in accordance with one or more embodiments of the present disclosure. FIG. 1E is a schematic ray diagram of annular illumination 116 incident on the sample 106 in accordance with one or more embodiments of the present disclosure. FIG. 1F is a schematic ray diagram of annular illumination 116 incident on the reference sample 144 in accordance with one or more embodiments of the present disclosure.

As illustrated in FIG. 1E, when the illumination 116 is focused at an interface 158 within the sample 106 (e.g., at a bottom surface 160 of the top substrate 162), reflected light from the interface 158 may be collected by the measurement objective lens 134. However, due to the proximity of the measurement objective lens 134 to the sample 106 and/or the selection of incident angles of the illumination 116, specular reflection 164 from an incident oblique ray 166 associated with annular illumination 116 may be blocked (e.g., by an aperture stop 168) or otherwise not collected. FIG. 1F illustrates a similar effect with the reference objective lens 142 and the reference sample 144, which is illustrated here as, but not limited to, a single substrate. Accordingly, the range of incident angles (or the NA range) associated with the annular illumination 116 may be selected based on the depth of the buried metrology target 104 and/or the working distance of the objective lenses (e.g., the measurement objective lens 134 and the reference objective lens 142) to at least partially suppress specular reflection from the top surfaces of the sample 106 and reference sample 144 during a sample position measurement.

Further, oblique illumination with a limited angular bandwidth may mitigate spherical aberration that may not be fully compensated with a collar correction ring on the objectives (e.g., the measurement objective lens 134 or the reference objective lens 142). In the case of a sample positioning sub-system 138 configured for interferometric measurements, a narrow angular bandwidth may provide high contrast and a relatively narrow interference signal envelope to facilitate sample positioning measurements with high repeatability and accuracy.

Referring generally to FIGS. 1G-1L, the use of a Linnik interferometer for sample positioning on a sample 106 is described in greater detail in accordance with one or more embodiments of the present disclosure. In FIGS. 1G-1L, the central wavelength of the illumination 116 was selected to be 1.3 μm and the sample includes two silicon wafer substrates having a thickness of 775 μm.

As illustrated by FIGS. 1G-1L, the interference signal exhibits a peak (here scaled to 0 μm) at a location of an interface between two surfaces within the sample 106, which may correspond to the location of the buried metrology target 104 or interfaces associated with any material layer within the sample 106. In this regard, the location of the interface (e.g., the location of the buried metrology target 104) may be determined by finding a center location of the envelope of the interference signal. Further, the width of the envelope may be related to the spatial resolution of the technique. This width may be generally influenced by multiple factors including, but not limited to, the coherence length of the illumination 116, the bandwidth of the illumination 116, or the angles of incidence of the illumination 116. For example, a narrow envelope width may be obtained using illumination with low temporal coherence or using high temporal coherence combined with high NA illumination.

Figure 1G:
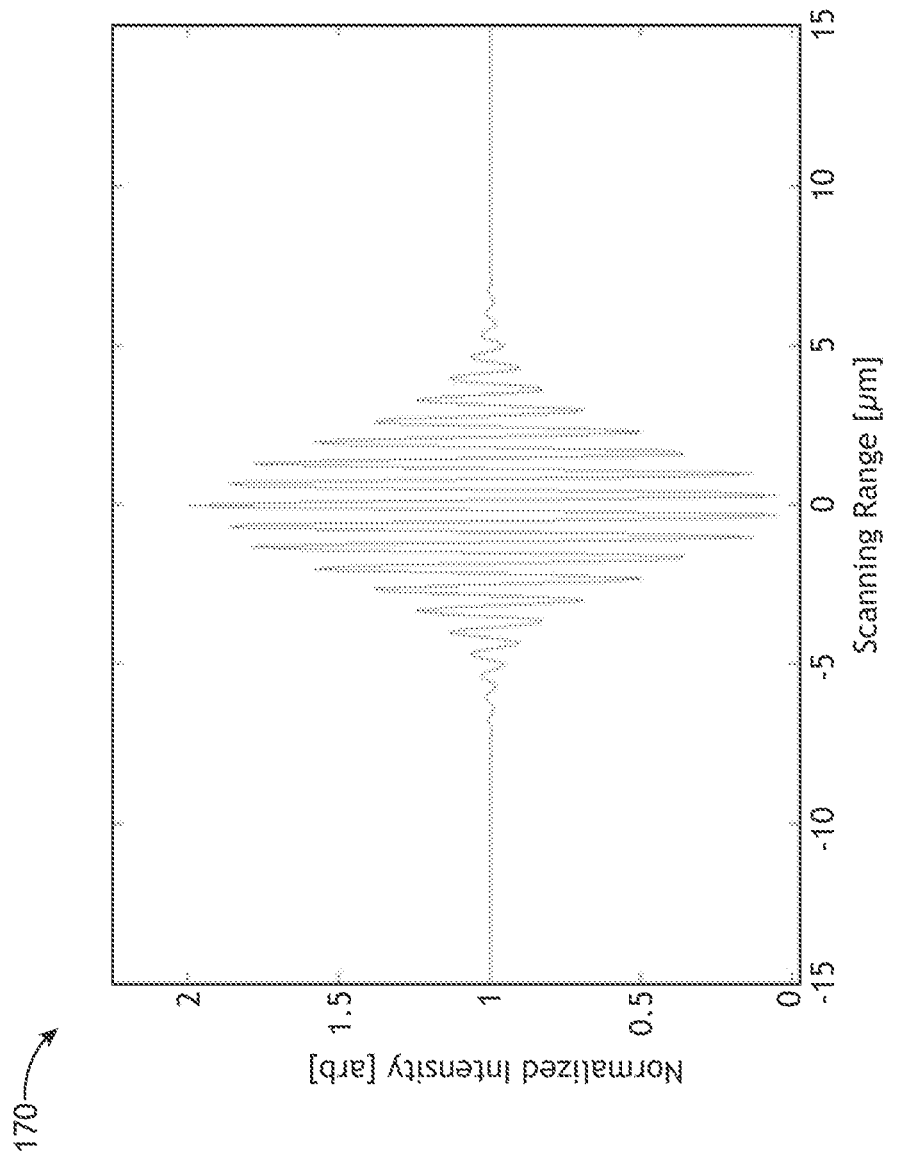
FIG. 1G includes a simulated plot of an expected interference signal as a function of scanning range with full illumination with a NA of 0.25 and a bandwidth (FWHM) of 160 nm, in accordance with one or more embodiments of the present disclosure.
Figure 1H:
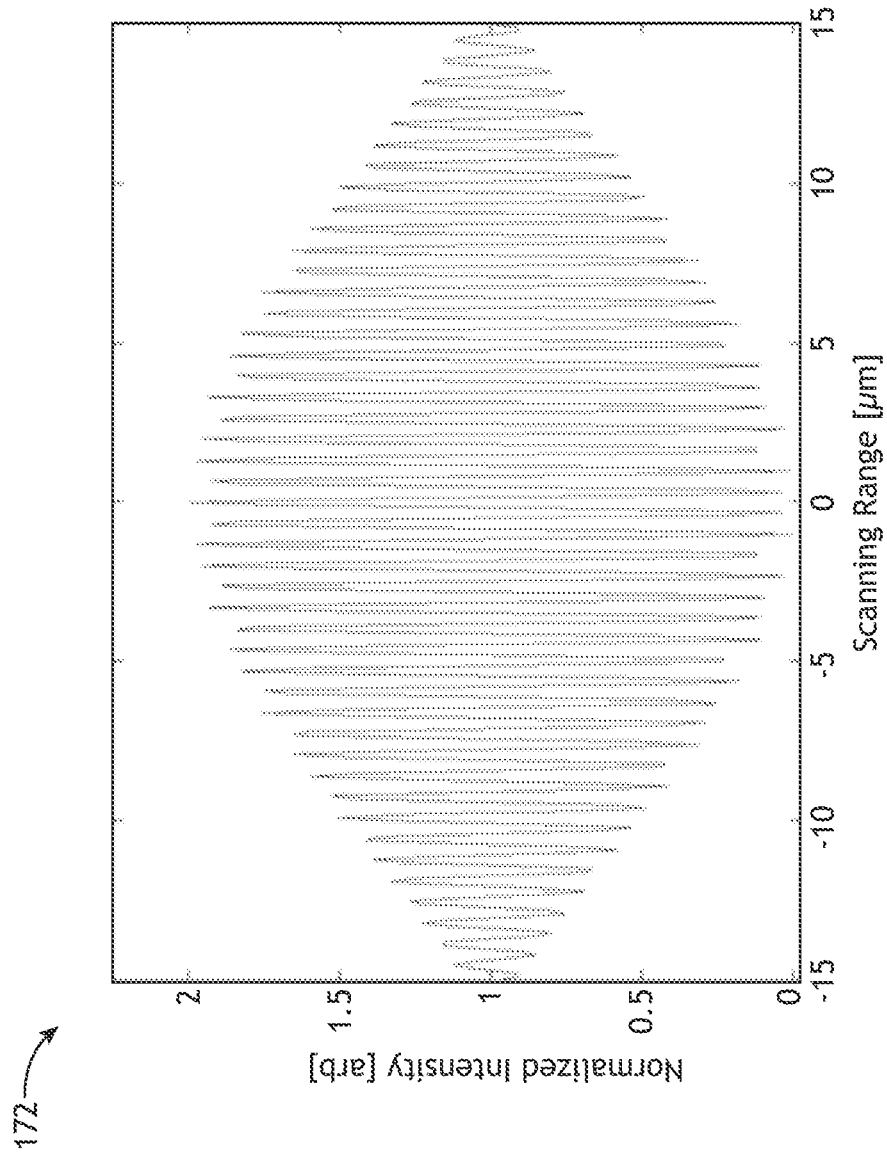
FIG. 1H includes a simulated plot of an expected interference signal as a function of scanning range with full illumination with a NA of 0.25 and a bandwidth (FWHM) of 5 nm, in accordance with one or more embodiments of the present disclosure.
Figure 1:
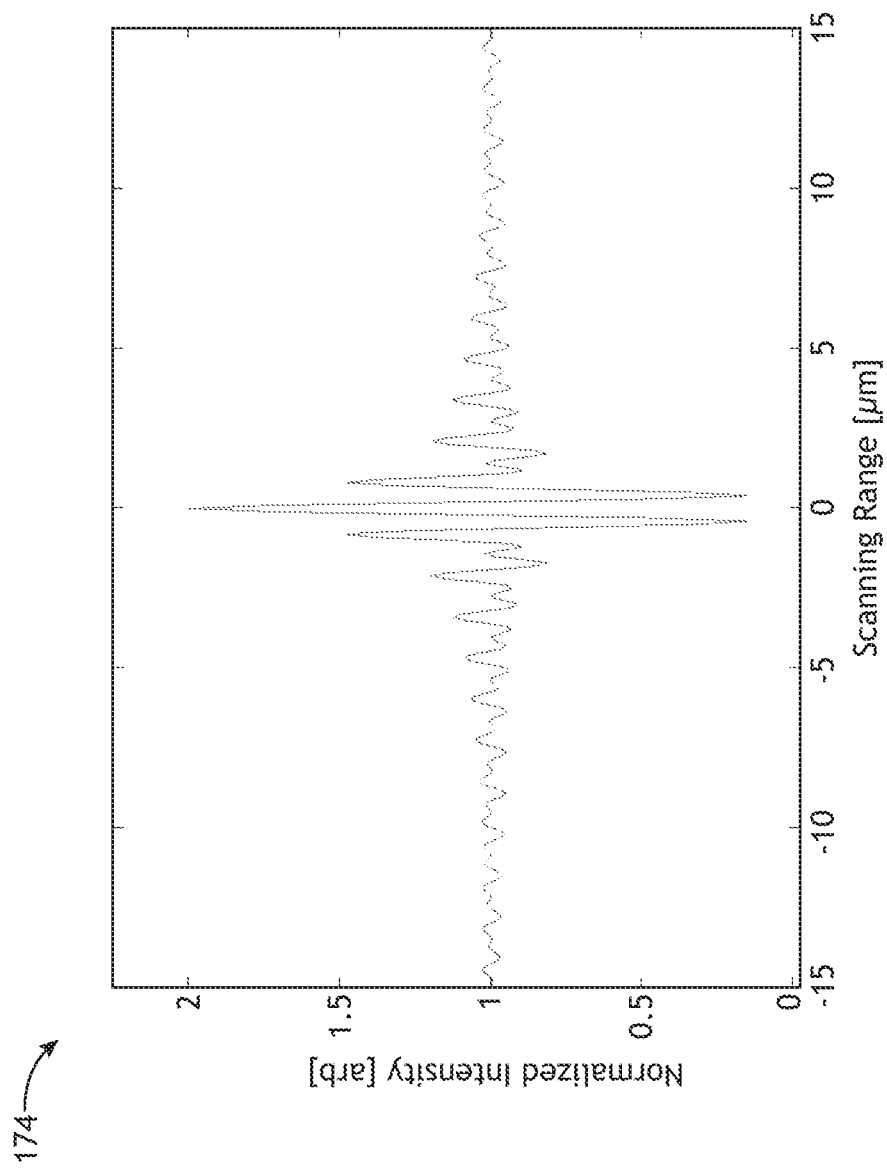
FIG. 1I includes a simulated plot of an expected interference signal as a function of scanning range with annular illumination with a NA ranging from 0.85-0.25, in accordance with one or more embodiments of the present disclosure.
FIG. 1J includes a simulated plot of an expected interference signal as a function of scanning range with annular illumination with a NA ranging from 0.85-0.65, in accordance with one or more embodiments of the present disclosure.
FIG. 1K is a simulated plot illustrating the detection of the top and bottom surfaces of a 6 µm thick silicon dioxide layer between the silicon substrates, in accordance with one or more embodiments of the present disclosure.
FIG. 1L is a simulated plot illustrating the detection of the top and bottom surfaces of a 10 µm thick silicon dioxide layer between the silicon substrates, in accordance with one or more embodiments of the present disclosure.
FIG. 1M is a plot of an interference signal collected using low NA illumination, in accordance with one or more embodiments of the present disclosure.
FIG. 1N is a plot of an interference signal collected using high NA illumination without a central obscuration, in accordance with one or more embodiments of the present disclosure.
FIG. 1O is a plot of interference signals captured through a sample thickness of 775 μm and 770 μm using high NA annular illumination, in accordance with one or more embodiments of the present disclosure.

FIGS. 1G and 1H illustrate the impact of the spectral bandwidth of the illumination 116. FIG. 1G includes a simulated plot 170 of an expected interference signal (e.g., as measured by the photodiode 150) as a function of scanning range with full illumination with a NA of 0.25 and a bandwidth (FWHM) of 160 nm, in accordance with one or more embodiments of the present disclosure. FIG. 1H includes a simulated plot 172 of an expected interference signal as a function of scanning range with full illumination with a NA of 0.25 and a bandwidth (FWHM) of 5 nm, in accordance with one or more embodiments of the present disclosure. As illustrated in FIGS. 1G and 1H, decreasing the spectral bandwidth of the illumination 116 may generally increase the coherence length of the illumination 116 and may thus provide a larger envelope. However, as described previously herein, it may be desirable to limit the spectral bandwidth of the illumination 116 (e.g., using the spectral filter 154) to mitigate chromatic aberration caused by propagation of the illumination 116 through portions of the sample 106. Accordingly, it is contemplated herein that the bandwidth of the illumination 116 may be selected to balance, among other things, the effects of chromatic aberration and coherence.

Figure 1J:
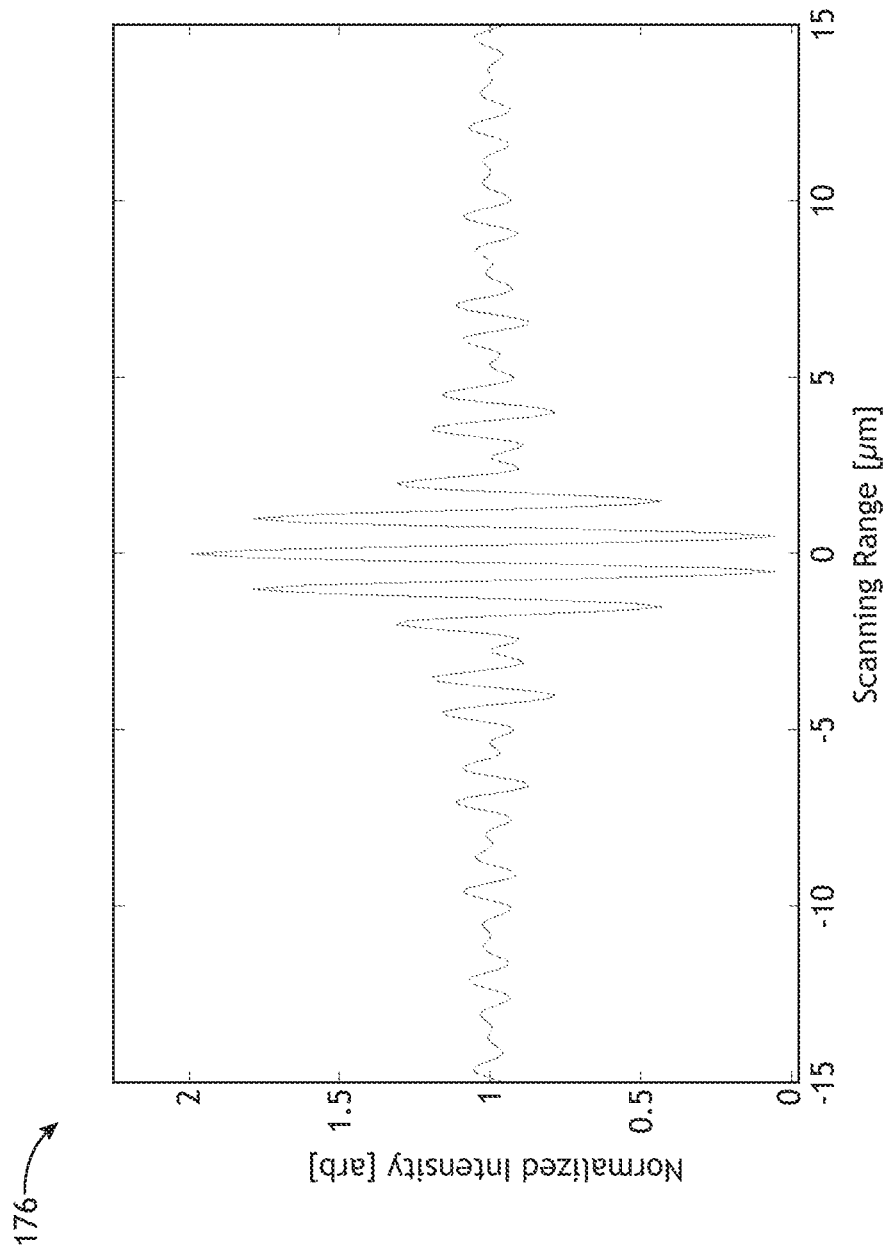

Referring now to FIGS. 1I and 1J, simulated interference signals for annular beams are illustrated in accordance with one or more embodiments of the present disclosure. FIG. 1I includes a simulated plot 174 of an expected interference signal as a function of scanning range with annular illumination 116 with a NA ranging from 0.85-0.25, in accordance with one or more embodiments of the present disclosure.

FIG. 1J includes a simulated plot 176 of an expected interference signal as a function of scanning range with annular illumination 116 with a NA ranging from 0.85-0.65, in accordance with one or more embodiments of the present disclosure. In FIGS. 1I and 1J, the illumination 116 had a central wavelength of 1.3 µm and a full-width half maximum (FWHM) of 5 nm. As illustrated in FIGS. 1I and 1J, the width of the envelope of the interference signal may be decreased (e.g., providing better spatial resolution along the scanning direction) by providing annular illumination 116 with a wider range of angles, provided that surface reflection is still blocked as illustrated in FIGS. 1E and 1F.

Figure 1K:
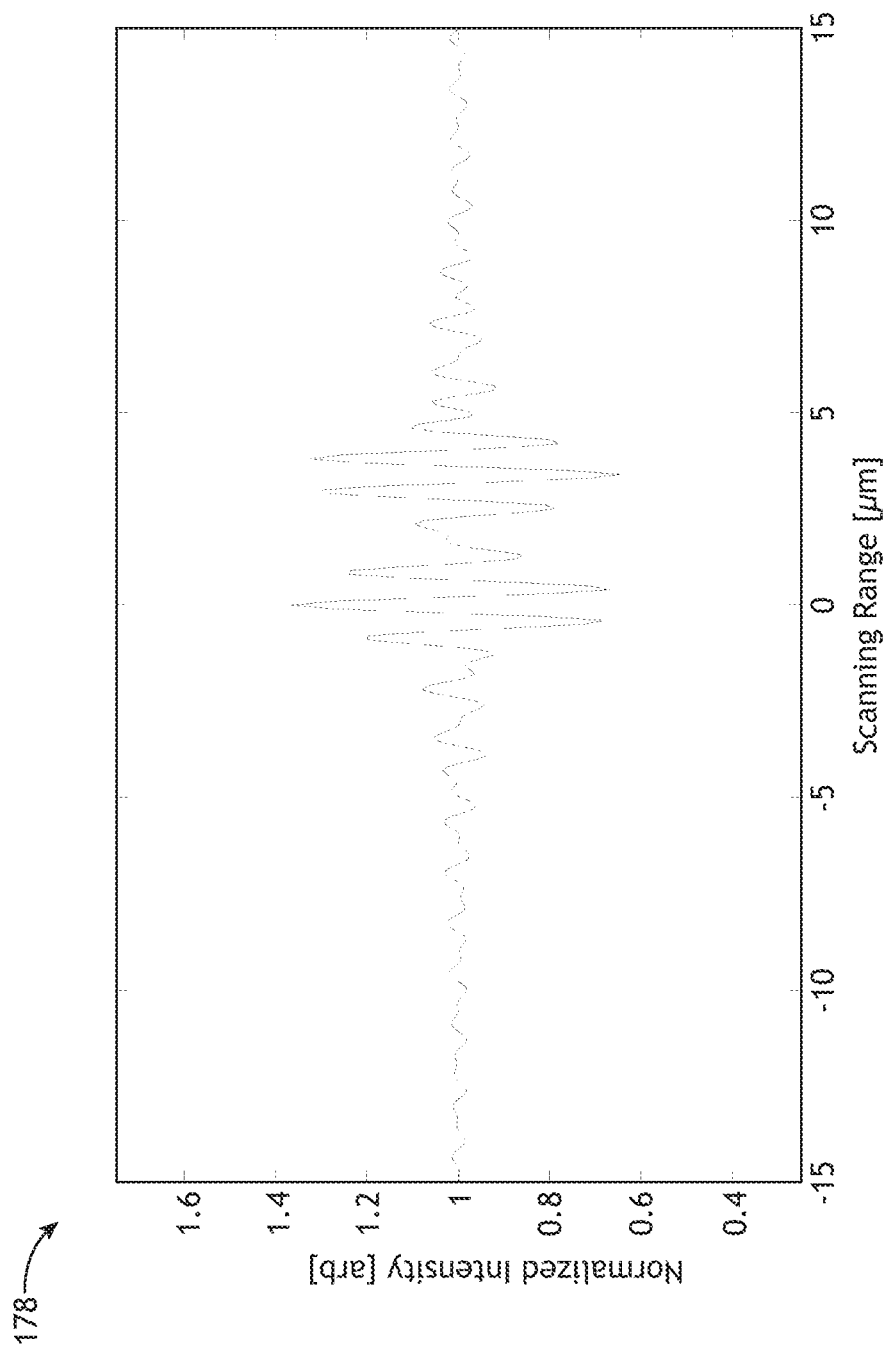
Figure 1L:
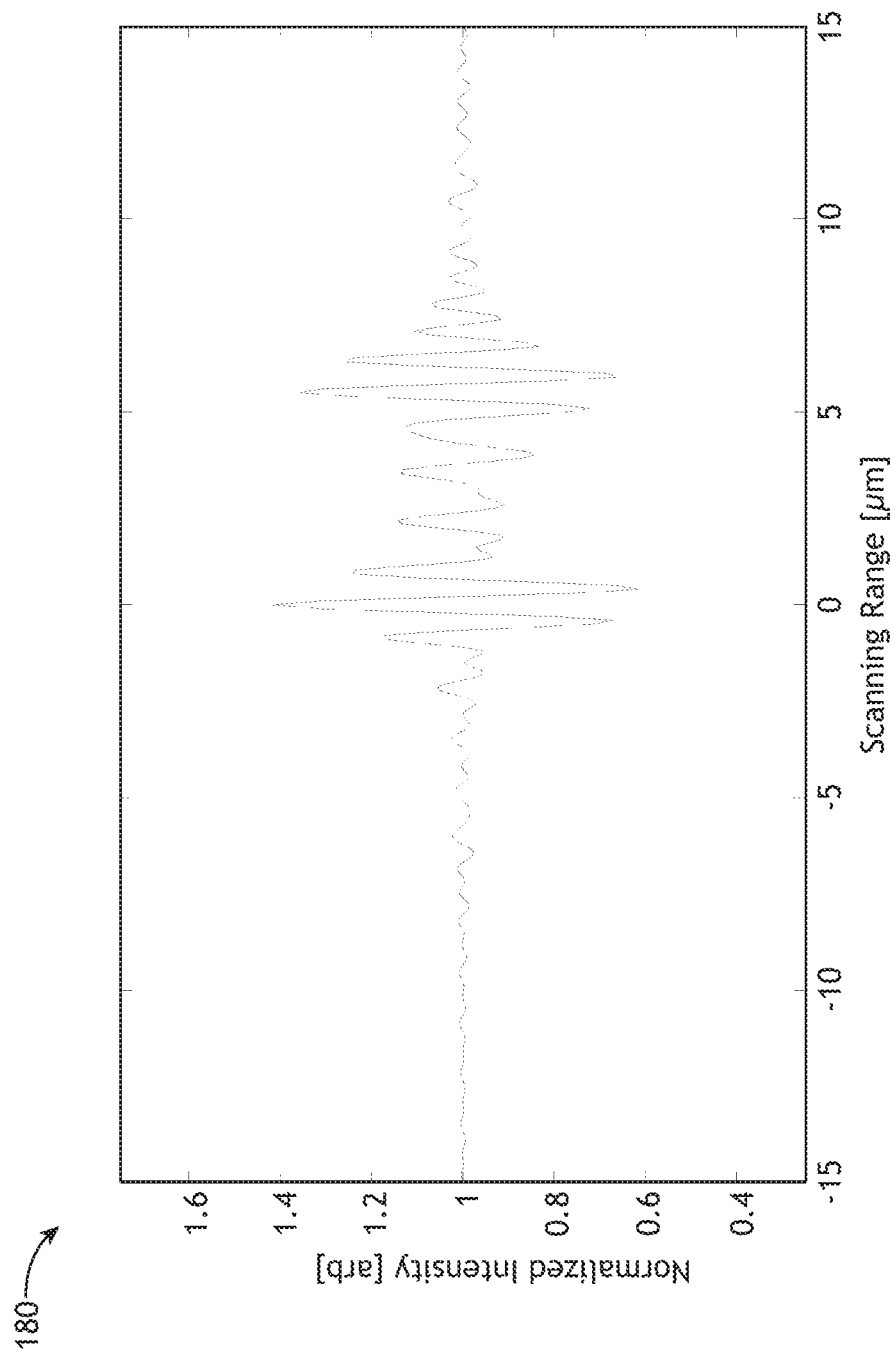

Referring now to FIGS. 1K and 1L, the use of a Linnik interferometer to distinguish between multiple interfaces is described in greater detail in accordance with one or more embodiments of the present disclosure. FIG. 1K is a simulated plot 178 illustrating the detection of the top and bottom surfaces of a 6 µm thick silicon dioxide layer between the silicon substrates, in accordance with one or more embodiments of the present disclosure. FIG. 1L is a simulated plot 180 illustrating the detection of the top and bottom surfaces of a 10 µm thick silicon dioxide layer between the silicon substrates, in accordance with one or more embodiments of the present disclosure. As illustrated by FIGS. 1K and 1L, this technique is suitable for identifying multiple interfaces, including an interface associated with a location of a buried metrology target 104.

Figure 1M:
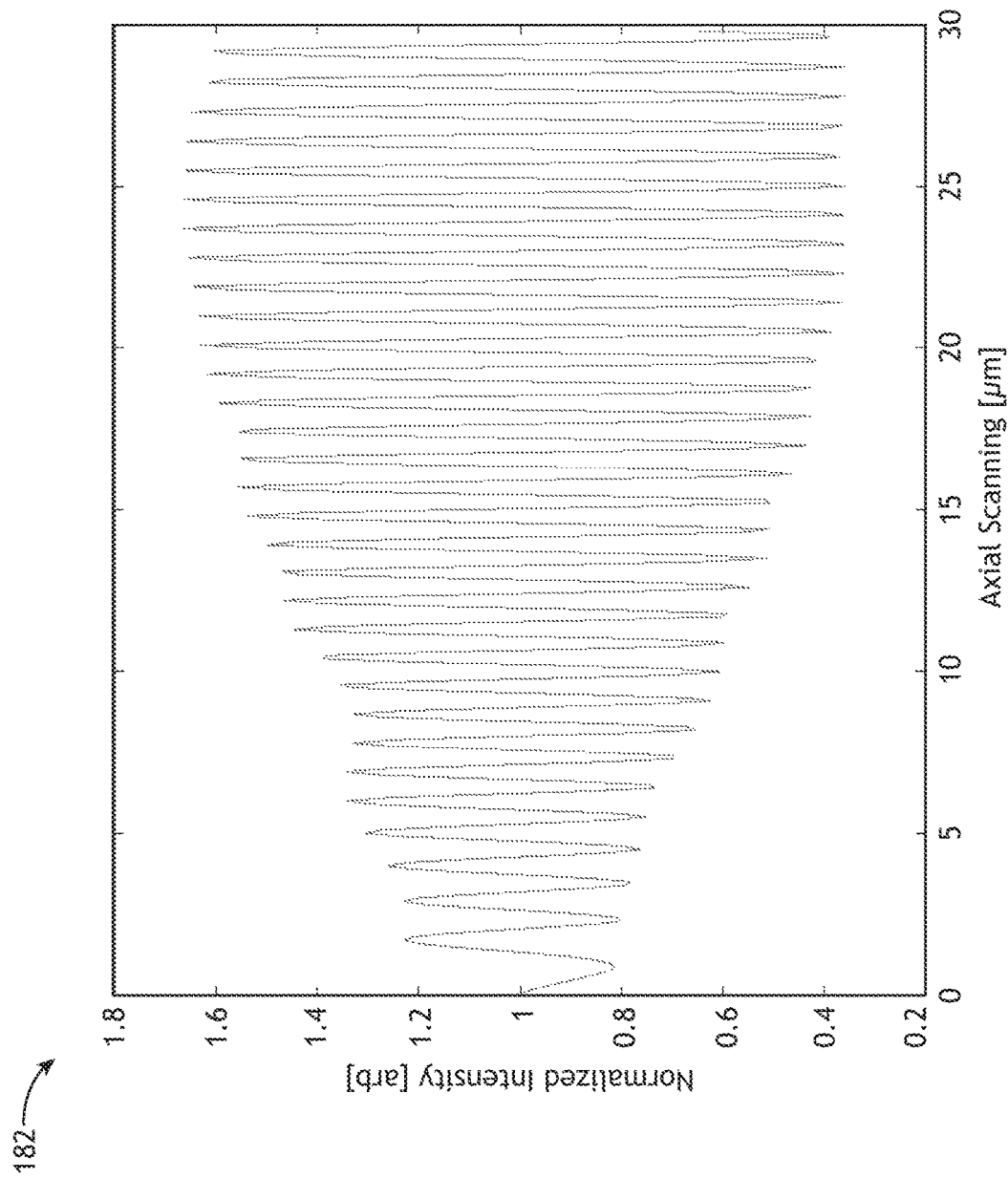
Figure 1N:
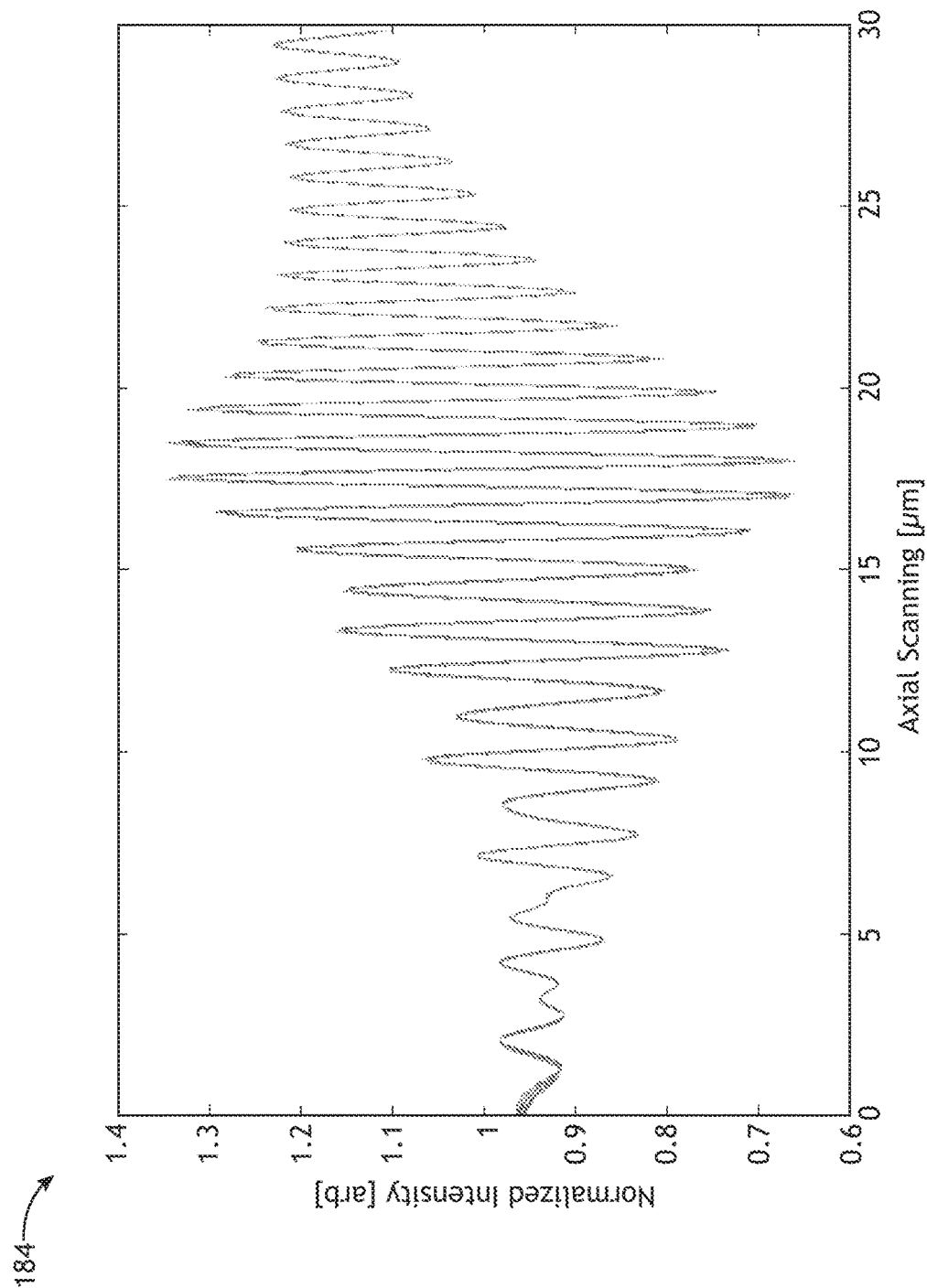
Figure 10:
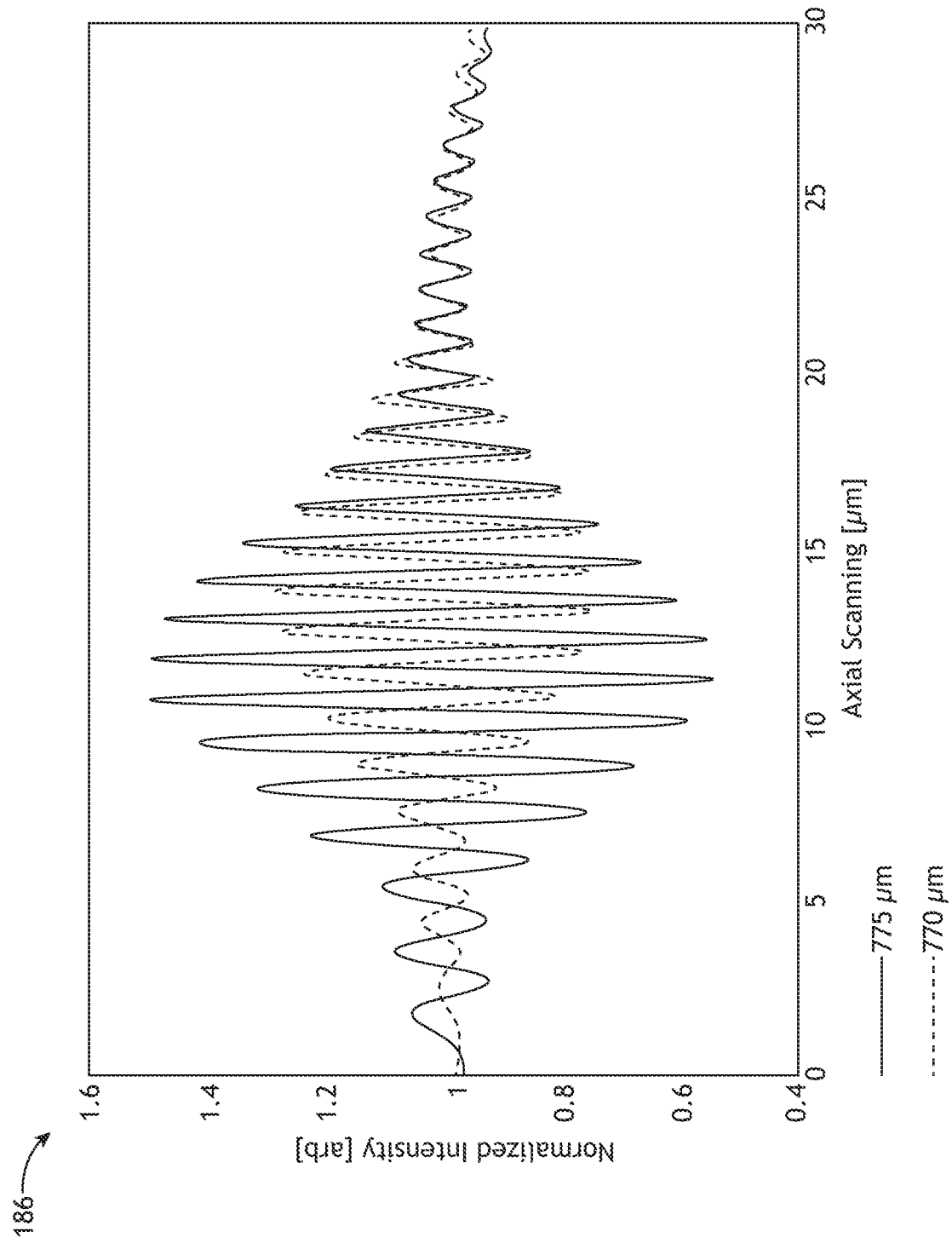

Referring now to FIGS. 1M-1O, experimental results of a Linnik interferometer for sample positioning measurements are illustrated in accordance with one or more embodiments of the present disclosure. In particular, FIGS. 1M-1O illustrate the use of illumination with a narrow spectral bandwidth coupled with high NA annular illumination with a limited angular bandwidth for sensitive sample positioning. In FIGS. 1M-1O, the sample 106 under test is a bare silicon wafer. Further, illumination 116 had a central wavelength of 1.5 µm and a bandwidth of 12 nm.

FIG. 1M is a plot 182 of an interference signal collected using low NA illumination, in accordance with one or more embodiments of the present disclosure. In particular, the plot 182 relates to a NA of 0.2. In FIG. 1M, the envelope of the interference signal is relatively large. FIG. 1N is a plot 184 of an interference signal collected using high NA illumination without a central obscuration, in accordance with one or more embodiments of the present disclosure. In particular, the plot 182 relates to a NA of 0.85. For example, the illumination used for FIG. 1N may include illumination at incidence angles ranging from 0 (normal incidence) to a high NA. As illustrated in FIG. 1N, increasing the NA of the illumination may reduce the envelope width. FIG. 1O is a plot 186 of interference signals captured through a sample thickness of 775 µm and 770 µm using high NA annular illumination, in accordance with one or more embodiments of the present disclosure. In particular, the sample 106 included a 5 µm etched stop on a backside to provide the two interference signals. As illustrated in FIG. 1O, the use of high NA illumination with a limited angular bandwidth (e.g., here annular illumination formed through the use of a central obscuration in an illumination pupil) may provide a well-defined interference peak with a relatively narrow envelope width. FIG. 1O further illustrates variations in the contrast of the interference signals at different depths. It is contemplated herein that further decreasing the spectral bandwidth of the illumination 116 (e.g., using the spectral filter 154 illustrated in FIG. 1C) may mitigate such contrast variations. For example, limiting the spectral bandwidth to a range of approximately 2-5 nm may provide suitable contrast over 20 µm thickness variations, which may be present in some semiconductor applications.

However, it is to be understood that the description of the sample positioning sub-system 138 as a Linnik interferometer in FIGS. 1C-1O, along with the associated descriptions, was provided solely for illustrative purposes and should not be interpreted as limiting. Rather, the metrology tool 102 may utilize any technique known in the art for determining and/or monitoring the position of the buried metrology target 104 including, but not limited to, techniques which utilize the principle of parallax. Examples include, but are not limited to, monitoring the lateral motion of the image of a spot generated on the sample with oblique illumination or monitoring lateral motion of the image of the overlay target when illuminated obliquely.

In another embodiment, the sample positioning sub-system 138 is communicatively coupled to the controller 108. In this regard, the controller 108 may adjust one or more components of the sample positioning sub-system 138 and/or receive data from the sample positioning sub-system 138 for determining and/or monitoring the position of the buried metrology target 104.

Referring now generally to any configuration of the sample positioning sub-system 138, the sample positioning sub-system 138 may determine the position of the buried metrology target 104 directly or indirectly. For example, the sample positioning sub-system 138 may directly locate and identify the location of the buried metrology target 104 within the sample 106 and adjust the translation stage 140 accordingly to position the buried metrology target 104 at a measurement plane of the metrology tool 102. By way of another example, the sample positioning sub-system 138 may locate and identify the location of one or more alternative interfaces in the sample 106 such as, but not limited to, a bottom surface 160 of the top substrate 162 as illustrated in FIGS. 1E and 1F. The sample positioning sub-system 138 may then position the buried metrology target 104 at a measurement plane of the metrology tool 102 based on a known offset between the detected interface and the buried metrology target 104.

Further, the system 100 may include a single metrology tool 102 or multiple metrology tools 102. A metrology system 100 incorporating multiple metrology tools 102 is generally described in U.S. Pat. No. 7,933,026 titled "High resolution monitoring of CD variations" issued on Apr. 26, 2011, and U.S. Pat. No. 7,478,019 titled "Multiple tool and structure analysis" issued on Jan. 13, 2009, both of which are incorporated herein by reference in their entirety. Focused beam ellipsometry based on primarily reflective optics is generally described in U.S. Pat. No. 5,608,526 titled "Focused beam spectroscopic ellipsometry method and system" issued on Mar. 4, 1997, which is incorporated herein by reference in its entirety. The use of apodizers to mitigate the effects of optical diffraction causing the spread of the illumination spot beyond the size defined by geometric optics is generally described in U.S. Pat. No. 5,859,424 titled "Apodizing filter system useful for reducing spot size in optical measurements and other applications" issued on Jan. 12, 1999, which is incorporated herein by reference in its entirety. The use of high-numerical-aperture tools with simultaneous multiple angle-of-incidence illumination is generally described by U.S. Pat. No. 6,429,943 titled "Critical dimension analysis with simultaneous multiple angle of incidence measurements" issued on Aug. 6, 2002, which is incorporated herein by reference in its entirety.

Figure 2:
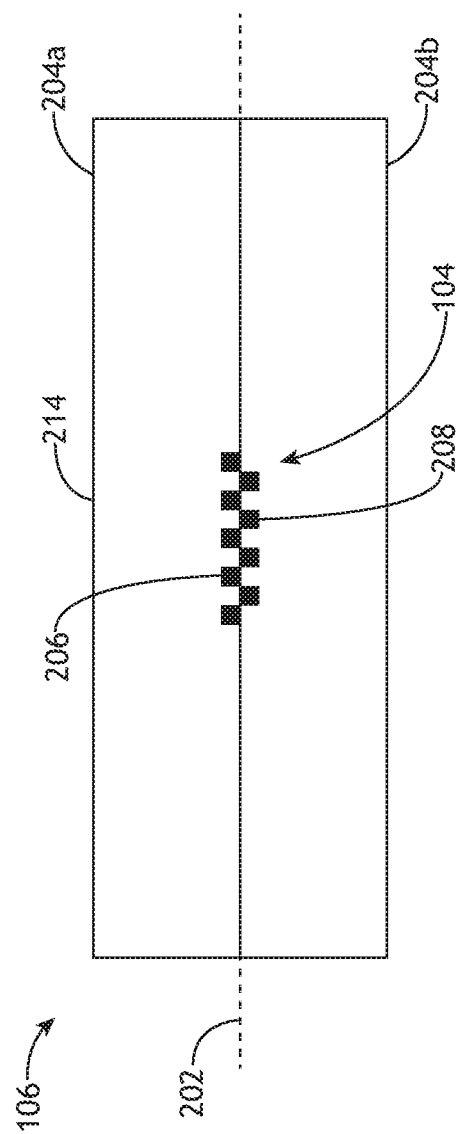
FIG. 2 is a profile view of a buried metrology target at an interface between two substrates of a bonded sample in accordance with one or more embodiments of the present disclosure.

Referring now to FIG. 2, a profile view of a buried metrology target 104 at an interface 202 between two substrates of a bonded sample 106 is shown in accordance with one or more embodiments of the present disclosure. In one embodiment, a sample 106 includes a first substrate 204a (e.g., a top substrate) and a second substrate 204b (e.g., a bottom substrate), where the buried metrology target 104 includes target features located on both substrates. For example, the sample 106 may include a bonded wafer sample in which the first substrate 204a and the second substrate 204b are semiconductor wafers.

In one embodiment, as illustrated in FIG. 2, the buried metrology target 104 is designed as an overlay metrology target. For example, the buried metrology target 104 illustrated in FIG. 2 includes a set of first-substrate target elements 206 on the first substrate 204a and a set of second-substrate target elements 208 on the second substrate 204b. In this regard, the alignment of the first-substrate target elements 206 with respect to the second-substrate target elements 208 is indicative of the alignment of the first substrate 204a relative to the second substrate 204b and thus the overlay of the sample 106.

The first-substrate target elements 206 and the second-substrate target elements 208 may be located on any layer of the first substrate 204a and the second substrate 204b. For example, the first substrate 204a and/or the second substrate 204b may include one or more layers of material deposited on a substrate of constant or varying thickness, out of which the target elements may be formed. Further, the first-substrate target elements 206 and the second-substrate target elements 208 may be formed from any type of material including, but not limited to a metal.

However, it is to be understood that the depiction in FIG. 2 of the buried metrology target 104 as an overlay metrology target associated with a bonded sample 106 is provided solely for illustrative purposes and should not be interpreted as limiting. Rather, the buried metrology target 104 may include any type of metrology target known in the art buried within a sample 106.

Figure 3:
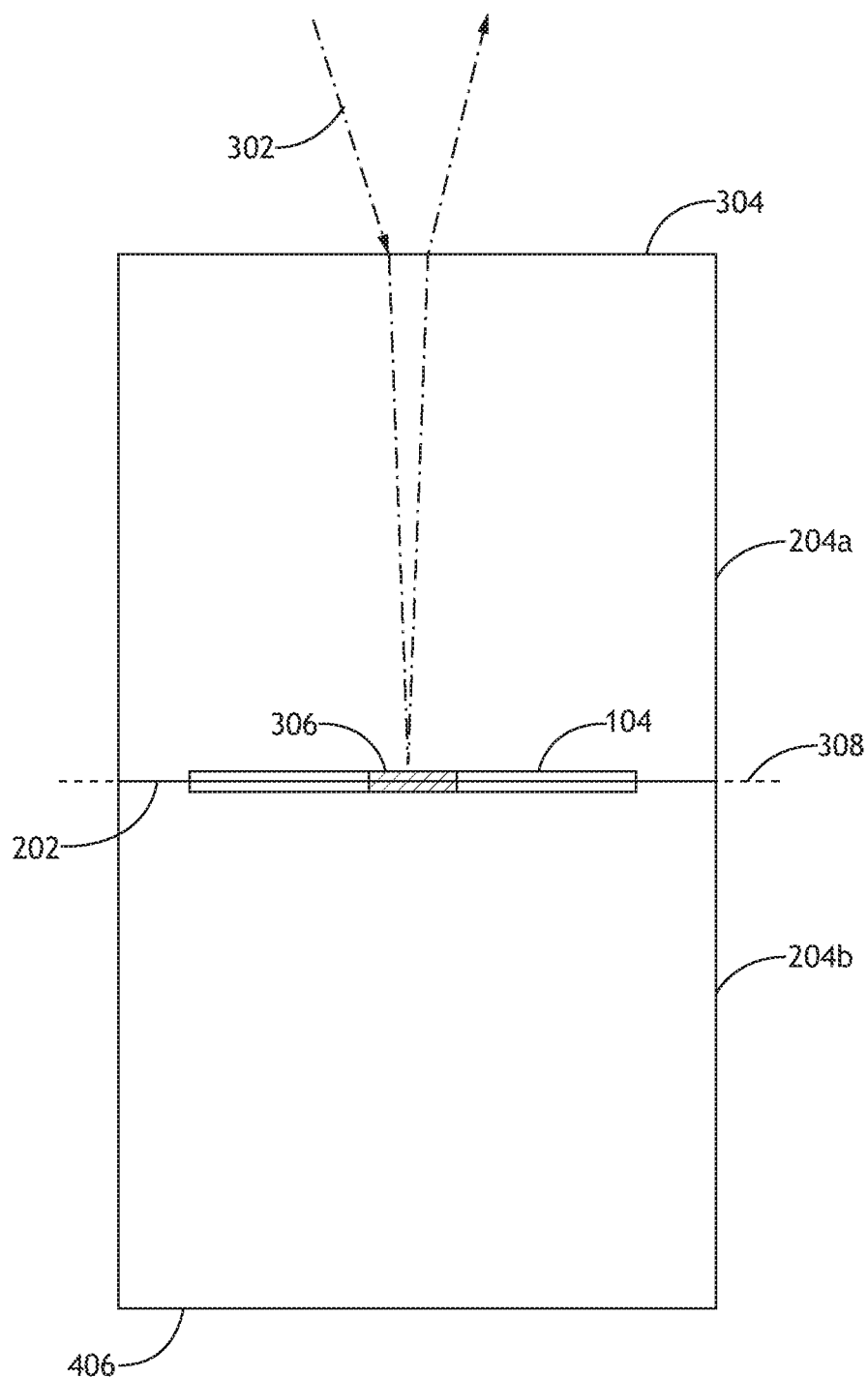
FIG. 3 is a simplified view of a desired configuration of light for performing measurements of a buried metrology target, in accordance with one or more embodiments of the present disclosure.
Figure 4:
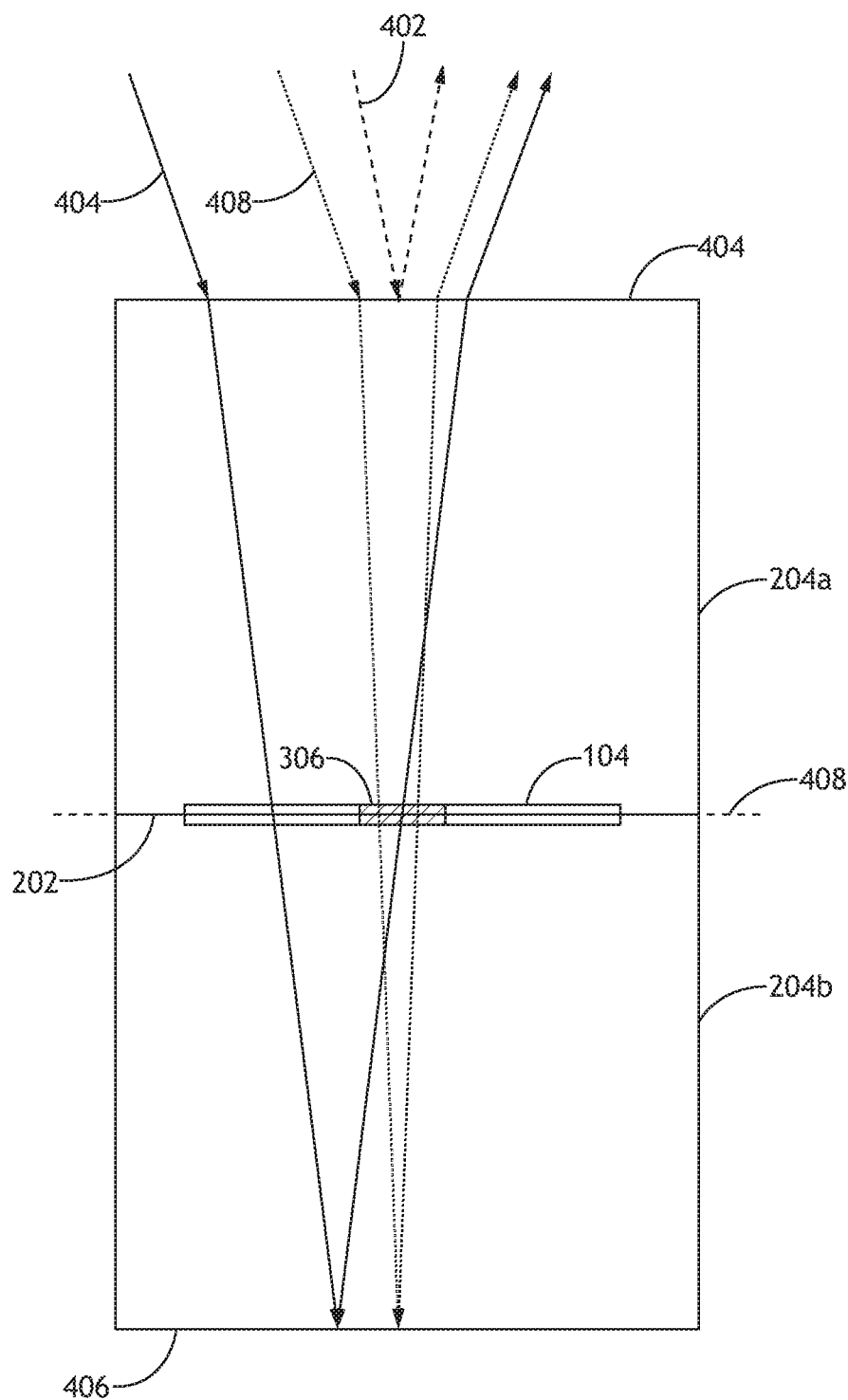
FIG. 4 is a simplified view of three types of spurious reflections that may introduce noise into images of the buried metrology target and/or metrology measurements, in accordance with one or more embodiments of the present disclosure.

Referring now to FIGS. 3 and 4, various spurious reflections that may introduce noise in measurement based on a buried metrology target 104 are described in greater detail in accordance with one or more embodiments of the present disclosure.

FIG. 3 is a simplified view of a desired configuration of light for performing measurements of a buried metrology target 104, in accordance with one or more embodiments of the present disclosure. In a signal path 302, illumination 116 from the illumination source 114 is directed to a top surface 304 of the sample 106, propagates through the first substrate 204a and interacts with a portion of the buried metrology target 104 within a detector field of view 306 (e.g., a field of view of the detector 124 through the collection pathway 120 at a measurement plane 308 including at least a portion of the buried metrology target 104). Subsequently, sample light 122 associated with reflections from the buried metrology target 104 propagates back through the first substrate 204a and exits the top surface 304. The sample light 122 exiting the top surface 304 may then be collected by the collection pathway 120 and directed to the detector 124.

FIG. 4 is a simplified view of three types of spurious reflections that may introduce noise into images of the buried metrology target 104 and/or metrology measurements, in accordance with one or more embodiments of the present disclosure.

In a first noise path 402, illumination 116 from the illumination source 114 reflects off of the top surface 304 of the first substrate 204a. This reflection may then be a part of the sample light 122 and, be collected by the collection pathway 120, and be directed to the detector 124. However, this reflection from the top surface 304 does not include any light from the portion of the buried metrology target 104 within the detector field of view 306 at the measurement plane 308 and may thus introduce noise to an image or a metrology measurement associated with the buried metrology target 104. In particular, this reflection from the top surface 304 may reduce the contrast or sensitivity of such an image or measurement.

In a second noise path 404, illumination 116 from the illumination source 114 propagates through the first substrate 204a and the second substrate 204b, but does not interact with the portion of the buried metrology target 104 within the detector field of view 306. For example, the illumination 116 along second noise path 404 may be laterally displaced from the detector field of view 306. Further, the illumination along the second noise path 404 may reflect off of the bottom surface 406 of the sample 106, pass through the detector field of view 306 and exit the top surface 304. Accordingly, this light may also be considered sample light 122 and may be collected by the collection pathway 120 and directed to the detector 124.

The sample light 122 along the second noise path 404 may also constitute noise if collected by the collected by the collection pathway 120 and directed to the detector 124. For example, portions of the sample light 122 along the second noise path 404 that propagate through the buried metrology target 104 within the detector field of view 306 after reflecting off of the bottom surface 406 will provide a substantively different signal than the light along the signal path 302 in FIG. 3. For instance, the light along the signal path 302 will include light reflecting off of target elements of the buried metrology target 104 (e.g., the first-substrate target elements 206 and/or the second-substrate target elements 208), whereas the light along the second noise path 404 will include light transmitting through gaps between the target elements of the buried metrology target 104 outside the detector field of view 306 prior to reflection off of the bottom surface 406 and also light transmitting through gaps between the target elements of the buried metrology target 104 within the detector field of view 306 after reflection off of the bottom surface 406. Further, the differences between the paths may introduce phase differences that may influence measurements with coherent illumination 116.

In a third noise path 408, illumination 116 from the illumination source 114 propagates through the first substrate 204a and passes through the buried metrology target 104 within the detector field of view 306, reflects off of the bottom surface 406, propagates back through the detector field of view 306, exits the top surface 304 and is collected by the collection pathway 120.

In this case, the light along the third noise path 408 may include light passing through gaps between the elements of the buried metrology target 104 and/or light not fully absorbed by the elements of the of the buried metrology target 104) and may contribute to noise in an image of the buried metrology target 104 or an associated metrology measurement for reasons similar to light along the first noise path 402 or the second noise path 404.

Referring now to FIGS. 5A-5D, the mitigation of spurious reflections using an illumination field stop 502 are described in greater detail in accordance with one or more embodiments of the present disclosure.

It is contemplated herein that light along the first noise path 402 and the second noise path 404 may be mitigated by an illumination field stop 502 in the illumination pathway 118 with an appropriately sized and shaped field-stop aperture 504.

In one embodiment, the size and/or shape of an illumination field of view at a measurement plane 308 (e.g., a plane corresponding to the buried metrology target 104) is designed to match the size and/or shape of the detector field of view 306 at the measurement plane 308.

In one embodiment, the illumination field stop 502 includes a field-stop aperture 504 sized such that a projection of the field-stop aperture 504 through the illumination pathway 118 to the measurement plane 308 matches the detector field of view 306, where the detector field of view 306 corresponds to a projection of a sensor in the detector 124 through the collection pathway 120 to the measurement plane 308.

It is recognized herein that a sensor on a detector 124 is typically rectangular or square such that the detector field of view 306 may be correspondingly rectangular or square. Accordingly, the illumination field stop 502 may have, but is not required to have, a field-stop aperture 504 shaped with the same aspect ratio as the sensor.

Figure 5A:
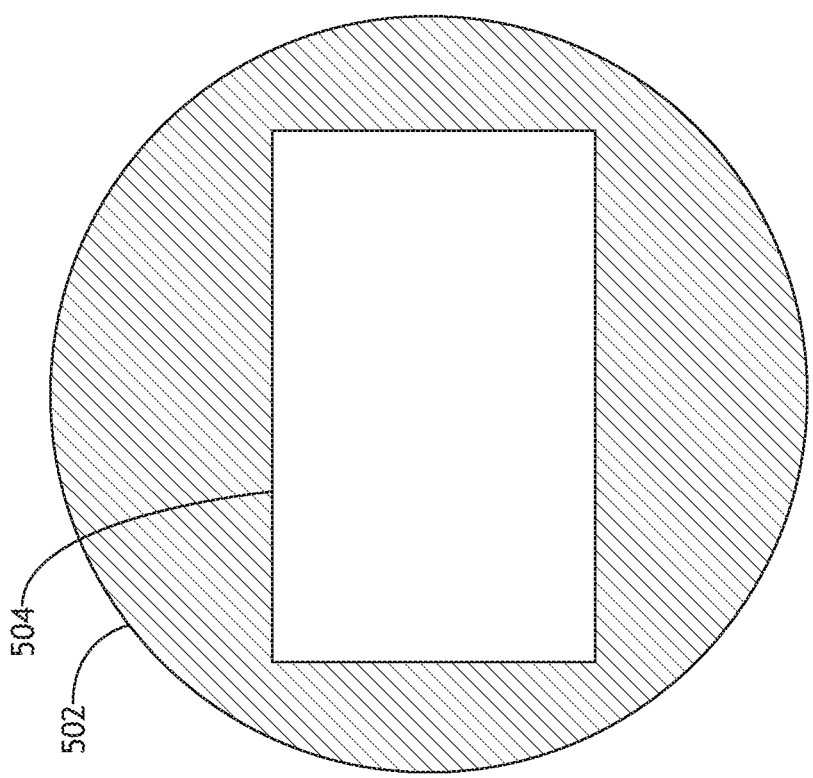
FIG. 5A is a schematic illustration of an illumination field stop located in a field plane of the illumination pathway having a rectangular-sized field-stop aperture in accordance with one or more embodiments of the present disclosure.
Figure 5B:
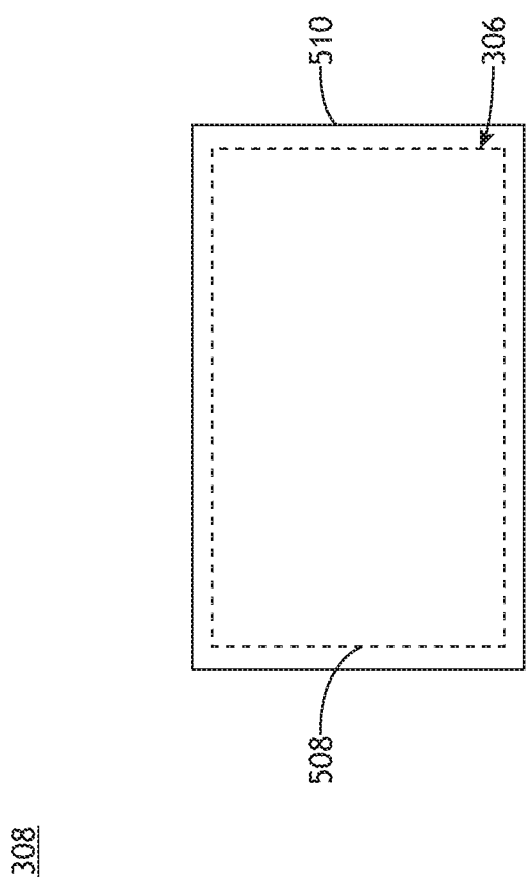
FIG. 5B is a schematic illustration of a measurement plane depicting a projection of a detector with a rectangular sensor and a projection of the rectangular field-stop aperture of FIG. 5A, in accordance with one or more embodiments of the present disclosure.

FIG. 5A is a schematic illustration of an illumination field stop 502 located in a field plane 506 of the illumination pathway 118 having a rectangular-sized field-stop aperture 504 in accordance with one or more embodiments of the present disclosure. FIG. 5B is a schematic illustration of a measurement plane 308 depicting a projection 508 of a detector 124 (e.g., the detector field of view 306) with a rectangular sensor and a projection 510 of the rectangular field-stop aperture 504 of FIG. 5A, in accordance with one or more embodiments of the present disclosure. In one embodiment, the field-stop aperture 504 is designed to have a rectangular or square shape having the same aspect ratio as the sensor of the detector 124. In this regard, the shape of the projections of the field-stop aperture 504 and the sensor of the detector 124 at the measurement plane may match. Further, the size of the projection 510 of the field-stop aperture 504 may be adjusted to match the projection 508 of the detector 124 completely or within a selected tolerance. For example, FIG. 5B illustrates a case in which the projection 510 of the field-stop aperture 504 slightly overfills the projection 508 of the detector 124 and is provided solely for illustrative purposes.

It is contemplated herein that the size of the projection 508 of the sensor in a detector 124 at the measurement plane 308 (e.g., the detector field of view 306) may be determined by the aspect ratio of the sensor and the magnification of the collection pathway 120 ($Mag_{coll}$). Similarly, the size of the projection 510 of the field-stop aperture 504 at the measurement plane 308 may be determined by the aspect ratio of the field-stop aperture 504 and the magnification of the illumination pathway 118 ($Mag_{ill}$).

Accordingly, the size of a field-stop aperture 504 may be adjusted such that the projection of the field-stop aperture 504 matches the detector field of view 306 based on known values of the aspect ratio of the sensor, the magnification of the collection pathway 120 ($Mag_{coll}$), and the magnification of the illumination pathway 118 ($Mag_{ill}$).

For example, in the case of a sensor having a×b square pixels with a pixel pitch (e.g., pixel size) of $l_p$ along the X and Y dimensions, respectively, the size of the rectangular field-stop aperture 504 in the illumination field stop 502 may be determined as:

$$d_{X,f} = a \cdot \frac{Mag_{ill}}{Mag_{coll}} \cdot l_p (1+k), \text{ and} \quad (1)$$

$$d_{Y,f}f = b \cdot \frac{Mag_{ill}}{Mag_{coll}} \cdot l_p (1+k), \quad (2)$$

where $d_{X,f}$ is the size of the field-stop aperture 504 along the X dimension, $d_{Y,f}$ is the size of the field-stop aperture 504 along the Y dimension, and k is a tolerance factor. For example, a value of k=0.05 may allow for a 5% tolerance in the size of the field-stop aperture 504.

It is contemplated herein that perfectly matching the projection 510 of the field-stop aperture 504 to the projection 508 of the detector 124 (e.g., the detector field of view 306) may be the most effective in blocking spurious reflections such as, but not limited to, the first noise path 402 and the second noise path 404 illustrated in FIG. 4. However, slight deviations from a perfect match (e.g., associated with non-zero values of k) may still provide effective blocking of many spurious reflections and may generally be effective for decreasing noise in an image of a buried metrology target 104 or an associated metrology measurement. Accordingly, it is to be understood that present disclosure is not limited by a particular value or range of values of k. In a non-limiting example, the value of k may be in the range of 0 to 0.05. In another non-limiting example, the value of k may be in the range of 0 to 0.1.

It is further contemplated herein that many optical elements in optical systems including, but not limited to, lenses and apertures are circular. Accordingly, it may be desirable for practical purposes to utilize a circular field-stop aperture 504 in an illumination field stop 502.

Figure 5C:
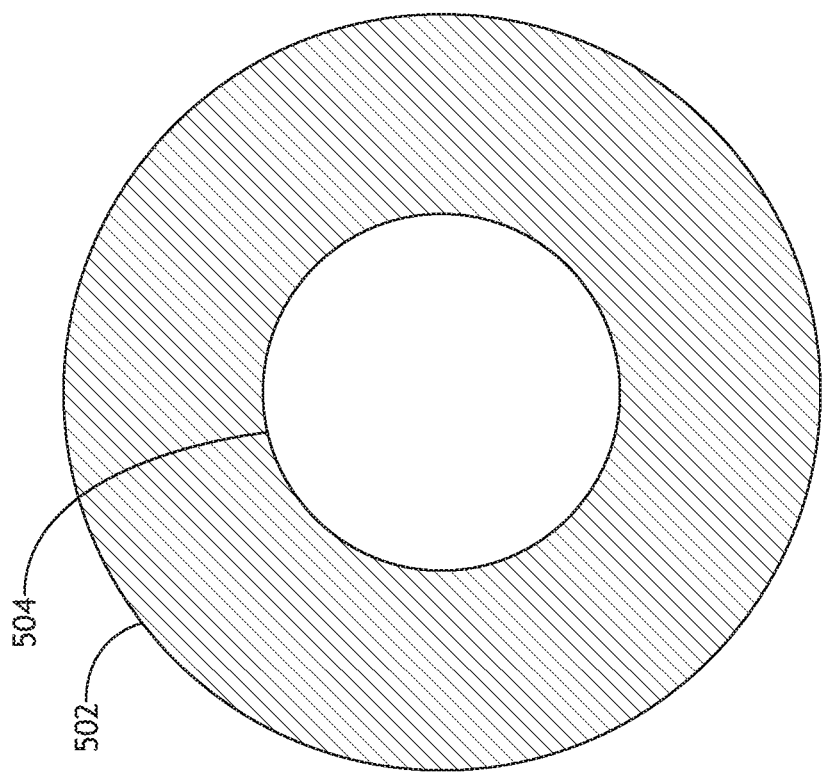
FIG. 5C is a schematic illustration of an illumination field stop located in the field plane of the illumination pathway having a circular-sized field-stop aperture in accordance with one or more embodiments of the present disclosure.
Figure 5D:
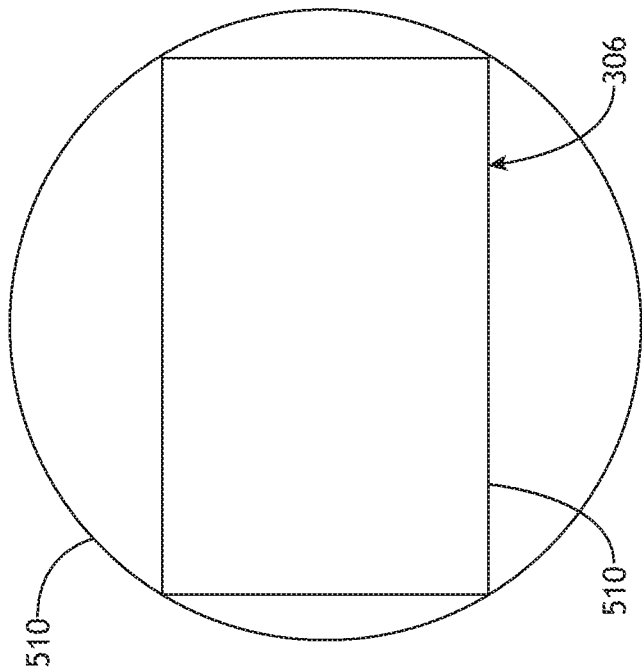
FIG. 5D is a schematic illustration of the measurement plane depicting a projection of a detector with a rectangular sensor and a projection of the circular field-stop aperture of FIG. 5C, in accordance with one or more embodiments of the present disclosure.

FIG. 5C is a schematic illustration of an illumination field stop 502 located in the field plane 506 of the illumination pathway 118 having a circular-sized field-stop aperture 504 in accordance with one or more embodiments of the present disclosure. FIG. 5D is a schematic illustration of the measurement plane 308 depicting a projection 508 of a detector 124 with a rectangular sensor and a projection 510 of the circular field-stop aperture 504 of FIG. 5C, in accordance with one or more embodiments of the present disclosure. In one embodiment, the field-stop aperture 504 is designed to be circular with a radius $r_f = \sqrt{a^2+b^2}$ corresponding to a maximum corner radius of a rectangular detector 124. In this regard, the illumination field stop 502 may include a traditional circular field-stop aperture 504.

Continuing the example above with a sensor having n×m square pixels with a pixel pitch of $l_p$, the radius, $r_f$, of a circular field-stop aperture 504 may be determined as:

$$r_f = \sqrt{a^2+b^2} \cdot \frac{Mag_{ill}}{Mag_{coll}} \cdot \frac{l_p}{2} (1+k). \quad (3)$$

Figure 6:
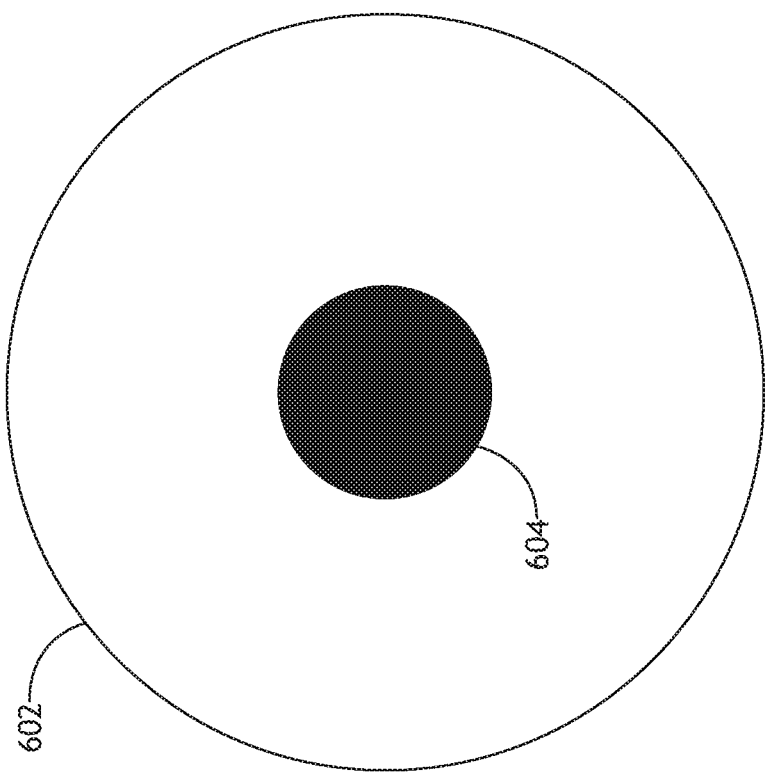
FIG. 6 is a schematic illustration of an illumination pupil stop with a central pupil obscuration located in the illumination pathway in accordance with one or more embodiments of the present disclosure.

Referring now to FIG. 6, mitigation of spurious reflections using an illumination pupil stop 602 with a central pupil obscuration 604 located in an illumination pupil plane 606 of the illumination pathway 118 are described in greater detail in accordance with one or more embodiments of the present disclosure.

It is contemplated herein that light along the third noise path 408 illustrated in FIG. 4 that passes through the buried metrology target 104 within the detector field of view 306, reflects off of the bottom surface 406 of the sample 106 and propagates back through the detector field of view 306 may be mitigated by an illumination pupil stop 602 located in the illumination pathway 118 with an appropriately sized and shaped central pupil obscuration 604. The central pupil obscuration 604 may block normal and near-normal illumination 116 from the illumination source 114 associated with the third noise path 408 from reaching the sample 106. The central pupil obscuration 604 may additionally block the light along the first noise path 402 or spurious reflections from outer surfaces of the sample 106 from reaching the detector.

FIG. 6 is a schematic illustration of an illumination pupil stop 602 with a central pupil obscuration 604 located in the illumination pathway 118 in accordance with one or more embodiments of the present disclosure.

In one embodiment, the illumination pathway 118 includes both an illumination field stop 502 as described previously herein and an illumination pupil stop 602 with a central pupil obscuration 604. In this configuration, the central pupil obscuration 604 may be sized based on known values of the size and shape of the field-stop aperture 504 (e.g., corresponding to the detector field of view 306), the thickness of the second substrate 204b (or more generally the thickness of the sample 106 between the buried metrology target 104 and the bottom surface 406), the refractive index, n, of the second substrate 204b corresponding to the wavelength(s) of the illumination 116 from the illumination source 114, or the thickness of the first substrate 204a. For example, the size of the central pupil obscuration 604 in terms of numerical aperture (NA) may be determined as:

$$NA_{obscuration} = n \cdot \sin\left(\frac{r_f}{W}\right) \cdot (1-k), \tag{4}$$

where n is the refractive index of the first substrate 204a, $r_f$ is a radius of the field-stop aperture 504 projected to the measurement plane 308, W is the thickness of the second substrate 204b, and k is a tolerance factor. For example, all reflections from outer surfaces may be blocked when the k=0 and the NA of the obscuration is greater than the calculated value. However, a value of k=0.3 may allow for a 30% tolerance in the size of the field-stop aperture 504.

As described with respect to equations (1)-(3) above, it is contemplated herein that perfectly defining the size of the central pupil obscuration 604 to block low-angle light from passing through the detector field of view 306 at the measurement plane 308, reflecting off of the bottom surface 406 of the sample 106 and passing again through the detector field of view 306 may be the most effective in blocking spurious reflections such as, but not limited to, the third noise path 408 illustrated in FIG. 4. However, slight deviations from a perfect match (e.g., associated with non-zero values of k) may still provide effective blocking of many spurious reflections and may generally be effective for decreasing noise in an image of a buried metrology target 104 or an associated metrology measurement. Accordingly, it is to be understood that present disclosure is not limited by a particular value or range of values of k. In a non-limiting example, the value of k may be in the range of 0 to 0.3. In another non-limiting example, the value of k may be in the range of 0 to 0.4.

Additionally, the shape of the central pupil obscuration 604 may be, but is not required to be, matched to the shape of the field-stop aperture 504. For example, the central pupil obscuration 604 may have a circular shape to match a circular field-stop aperture 504 (e.g., as described with respect to equation (4) above). By way of another example, the central pupil obscuration 604 may have a rectangular shape to match a rectangular field-stop aperture 504. By way of another example, the central pupil obscuration 604 may have a rectangular shape and field-stop aperture 504 may have a circular shape. By way of another example, the central pupil obscuration 604 may have a circular shape and field-stop aperture 504 may have a rectangular shape.

In another embodiment, the illumination pathway 118 includes an illumination pupil stop 602 with a central pupil obscuration 604, but not an illumination field stop 502 as described previously herein. In this configuration, the central pupil obscuration 604 may be sized based on known values of the size and shape of the detector field of view 306 at the measurement plane 308. It is contemplated herein that this configuration may block at least some spurious reflections from surfaces other than the buried metrology target 104, but that the effectiveness of the illumination pupil stop 602 without an illumination field stop 502 may depend on the size of the field of view of the illumination 116 at the measurement plane 308.

Referring now to FIG. 7, FIG. 7 is a flow diagram illustrating steps performed in a method 700 for metrology on a buried metrology target, in accordance with one or more embodiments of the present disclosure. Applicant notes that the embodiments and enabling technologies described previously herein in the context of system 100 should be interpreted to extend to method 700. It is further noted, however, that the method 700 is not limited to the architecture of system 100.

In one embodiment, the method 700 includes a step 702 of illuminating a buried metrology target, where the illumination on the target is tailored using a field-stop aperture such that a projected size of the field-stop aperture on a measurement plane corresponding to the metrology target matches a field of view of an imaging detector at the measurement plane, where the illumination is further tailored using an illumination pupil with a central obscuration to block illumination at angles below a cutoff angle, the cutoff angle selected to prevent illumination from reflecting off of at least one of the top or bottom surfaces of the sample from reaching the detector. For example, the illumination may be tailored using an illumination field stop 502 with a field-stop aperture 504 located in an illumination pathway 118 such that a projected size of the field-stop aperture 504 on a measurement plane 308 corresponding to the buried metrology target 104 matches a detector field of view 306 as described previously herein. In this regard, the step 702 may include mitigation of spurious reflections including, but not limited to, those in the first noise path 402 and the second noise path 404 as described with respect to FIG. 4. Further, the illumination may be tailored using an illumination pupil stop 602 with a central pupil obscuration 604 located in the illumination pathway 118 to block illumination at angles below the selected cutoff angle as described previously herein. In this regard, the step 702 may include mitigation of spurious reflections including, but not limited to, those in the third noise path 408 or the first noise path 402 as described with respect to FIG. 4. As a result of the tailored illumination, the resulting collected light (e.g., sample light 122) may be restricted to the signal path 302.

In another embodiment, the method 700 includes a step 704 of generating one or more images of the metrology target on the imaging detector. For example, the step 704 may include generating any combination of field-plane images (e.g., using a detector 124 located at a field plane conjugate to the buried metrology target 104) or pupil-plane images (e.g., using a detector 124 located at a pupil plane to capture an angular distribution of light from the buried metrology target 104). Further, the images may be generated using any type of imaging technique known in the art including, but not limited to, brightfield imaging.

In another embodiment, the method 700 includes a step 706 of generating one or more metrology measurements of the sample based on the one or more images. For example, the one or more metrology measurements may include, but are not limited to, one or more overlay measurements. In particular, the sample may include a bonded sample formed from two substrates bonded together at an interface, where the buried metrology target includes features from both substrates. Accordingly, a metrology measurement based on the one or more images may provide an indication of the relative alignment, or misalignment, of the two substrates.

In another embodiment, though not shown in FIG. 7, the method 700 may include a step of positioning the metrology target at the measurement plane prior to generating the one or more images in step 704. For example, the method may include detecting and/or monitoring the position of the buried metrology target 104 and adjusting the position of the buried metrology target 104 within a measurement tool. Further, the method 700 may include detecting and/or monitoring the position of the buried metrology target 104 using any technique known in the art including, but not limited to, the Linnik interferometry technique illustrated in FIGS. 1C-1L.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
  an imaging sub-system configured to image a metrology target buried in a sample on a detector based on light collected from an objective lens, wherein the sample is formed from a first substrate and a second substrate bonded to the first substrate at an interface, the sample further including the metrology target located at the interface, wherein the metrology target includes a first target structure on the first substrate and a second target structure on the second substrate;
  an illumination sub-system comprising:
    an illumination source;
    one or more illumination optics configured to illuminate the metrology target with illumination from the illumination source through the objective lens;
    an illumination field stop located at a field plane conjugate to the metrology target, wherein the illumination field stop includes a field-stop aperture, wherein at least one of a size or shape of the field-stop aperture is selected to provide that a projected size of the field-stop aperture on a measurement plane corresponding to the metrology target matches a field of view of the detector at the measurement plane; and
    an illumination pupil located at a pupil plane, wherein the illumination pupil includes a central obscuration in a center of the pupil plane, wherein at least one of a size or shape of the central obscuration is selected to provide oblique illumination of the metrology target with angles greater than a cutoff angle, wherein the cutoff angle is selected, based on at least one of a size of the field of view of the detector at the measurement plane, a thickness of the first substrate, or a thickness of the second substrate, to prevent reflections of the illumination from the illumination source off of at least one of a top surface or a bottom surface of the sample from reaching the detector; and
  a controller communicatively coupled to the detector, wherein the controller includes one or more processors configured to execute program instructions causing the one or more processors to:
  receive one or more images of the metrology target from the sample; and
  generate one or more metrology measurements of the sample based on the one or more images.

2. The metrology system of claim 1, further comprising:
  a sample positioning sub-system including a translation stage communicatively coupled to the controller, wherein the one or more processors are further configured to execute program instructions causing the one or more processors to:
  receive sample positioning data from the sample positioning sub-system; and
  direct the translation stage, through one or more control signals, to align the metrology target to the measurement plane prior to receiving the one or more images of the metrology target.

3. The metrology system of claim 2, wherein the sample positioning sub-system further comprises:
  at least one of an interferometer or a parallax positioning sub-system.

4. The metrology system of claim 2, wherein the sample positioning sub-system further comprises:
a beamsplitter configured to split sample-positioning illumination from the illumination source into a measurement arm and a reference arm, wherein the measurement arm includes the objective lens configured to direct the sample positioning illumination to the sample, wherein the reference arm includes a reference objective lens configured to direct the sample-positioning illumination to a reference sample; and
a photodiode configured to receive light from the beamsplitter associated with interference of light in the measurement arm with light from the reference arm, wherein the photodiode generates the sample positioning data.

5. The metrology system of claim 4, wherein the sample-positioning illumination includes the illumination from the illumination source.

6. The metrology system of claim 4, wherein the sample-positioning illumination includes the illumination from an additional illumination source.

7. The metrology system of claim 4, wherein the sample positioning data includes an interference signal generated as the translation stage translates the sample along an optical axis of the objective lens.

8. The metrology system of claim 7, wherein a location of the metrology target is determinable based on a position of a peak of the interference signal.

9. The metrology system of claim 4, wherein the reference sample is formed from one or more reference substrates.

10. The metrology system of claim 9, the reference sample further comprises:
a reflective layer on at least one of a back surface or an interface between two reference substrates.

11. The metrology system of claim 1, wherein at least one of the one or more metrology measurements comprises:
an overlay measurement between the first substrate and the second substrate.

12. The metrology system of claim 11, wherein the metrology target comprises:
at least one of an AIM target, an rAIM target, an AIMid target, or a BiB target.

13. The metrology system of claim 12, wherein the illumination from the illumination source comprises:
illumination including one or more wavelengths in an infrared spectral range.

14. The metrology system of claim 1, wherein the cutoff angle is further selected to prevent reflections from outer surfaces of the sample from reaching the detector.

15. The metrology system of claim 1, wherein the field-stop aperture is circular with a radius of $r_f$, wherein the central obscuration of the illumination pupil is sized to block illumination from the illumination source having a numerical aperture smaller than $$n \cdot \sin\left(\mathrm{atan}\left(\frac{r_f}{W}\right)\right) \cdot (1-k),$$

wherein n is a refractive index of the first substrate, $r_f$ is the projected size of the field-stop aperture on the measurement plane, and k is a tolerance factor.

16. The metrology system of claim 1, wherein providing that the projected size of the field-stop aperture on the measurement plane corresponding to the metrology target matches the field of view of the detector at the measurement plane prevents reflections of illumination from the illumination source from reflecting off of a top surface of the sample and being captured by the detector.

17. The metrology system of claim 1, wherein providing that the projected size of the field-stop aperture on the measurement plane corresponding to the metrology target matches the field of view of the detector at the measurement plane prevents reflections of illumination from the illumination source from reflecting off of the bottom surface of the sample and propagating through the field of view of the detector at the measurement plane.

18. The metrology system of claim 1, wherein the detector has a rectangular sensor with a known aspect ratio, wherein the shape of the field-stop aperture is selected to be rectangular with the known aspect ratio.

19. The metrology system of claim 18, wherein a size of the field-stop aperture along a first direction, $d_{X,f}$, is selected to be $d_{X,f} = a \cdot (\mathrm{Mag}_{ill}/\mathrm{Mag}_{coll}) \, l_p (1+k_f)$, where a is a number of square pixels of size $l_p$ in the detector along the first direction, $\mathrm{Mag}_{ill}$ is a magnification of the illumination sub-system, $\mathrm{Mag}_{coll}$ is a magnification of the collection sub-system, and k is a tolerance factor, wherein the size of the field-stop aperture along a second direction, d", is selected to be $d_{Y,f} = b \cdot (\mathrm{Mag}_{ill}/\mathrm{Mag}_{coll}) \cdot l_p (1+k_f)$, where b is a number of square pixels of size $l_p$ in the detector along the second direction.

20. The metrology system of claim 19, wherein $k_f$ is in a range from 0 to 0.05.

21. The metrology system of claim 1, wherein the detector has a rectangular sensor with a known aspect ratio, wherein the shape of the field-stop aperture is selected to be circular, wherein the projected size of the field-stop aperture on the measurement plane encapsulates the field of view of the detector at the measurement plane.

22. The metrology system of claim 21, wherein the detector has a size of (n×m) square pixels of size $l_p$, wherein the field-stop aperture has a radius of $r = \sqrt{n^2 + m^2} \cdot (\mathrm{Mag}_{ill}/\mathrm{Mag}_{coll}) \cdot (l_p/2) \cdot (1+k)$, where $\mathrm{Mag}_{ill}$ is a magnification of the illumination sub-system, $\mathrm{Mag}_{coll}$ is a magnification of the collection sub-system, and k is a tolerance factor.

23. The metrology system of claim 22, wherein $k_f$ is in a range from 0 to 0.3.

24. The metrology system of claim 1, wherein at least one of the first substrate or the second substrate has a thickness of at least one of 775 μm, 750 μm, 600 μm, 300 μm, or 100 μm.

25. The metrology system of claim 1, wherein at least one of the first substrate or the second substrate comprises:
a semiconductor wafer.

26. A metrology system comprising:
an imaging sub-system configured to image a metrology target buried in a sample on a detector based on light collected from an objective lens, wherein the sample is formed from a first substrate and a second substrate bonded to the first substrate at an interface, the sample further including the metrology target located at the interface, wherein the metrology target includes a first target structure on the first substrate and a second target structure on the second substrate;
a sample positioning sub-system including a translation stage to position the metrology target at a measurement plane of the detector;

an illumination sub-system comprising:
an illumination source;
one or more illumination optics configured to illuminate the metrology target with illumination from the illumination source through the objective lens; and
a pupil stop located at a pupil plane, wherein the pupil stop includes a central obscuration in a center of the pupil plane, wherein at least one of a size or shape of the central obscuration is selected to provide oblique illumination of the metrology target with angles greater than a cutoff angle, wherein the cutoff angle is selected, based on at least one of a size of a field of view of the detector at the measurement plane, a thickness of the first substrate, or a thickness of the second substrate, to prevent reflections of the illumination from the illumination source off of at least one of a top surface or a bottom surface of the sample from reaching the detector; and
a controller communicatively coupled to the detector, wherein the controller includes one or more processors configured to execute program instructions causing the one or more processors to:
receive one or more images of the metrology target from the sample; and
generate one or more metrology measurements of the sample based on the one or more images.

27. The metrology system of claim 26, wherein the sample positioning sub-system further comprises:
a beamsplitter configured to split sample-positioning illumination from the illumination source into a measurement arm and a reference arm, wherein the measurement arm includes the objective lens configured to direct the sample-positioning illumination to the sample, wherein the reference arm includes a reference objective lens configured to direct the sample-positioning illumination to a reference sample; and
a photodiode configured to receive light from the beamsplitter associated with interference of light in the measurement arm with light from the reference arm, wherein the photodiode generates sample positioning data.

28. The metrology system of claim 27, wherein the sample-positioning illumination includes the illumination from the illumination source.

29. The metrology system of claim 27, wherein the sample-positioning illumination includes the illumination from an additional illumination source.

30. The metrology system of claim 27, wherein the reference sample is formed from one or more reference substrates.

31. The metrology system of claim 30, wherein the reference sample further comprises:
a reflective layer on at least one of a back surface or an interface between two reference substrates.

32. The metrology system of claim 26, wherein the cutoff angle is further selected to prevent reflections from outer surfaces of the sample from reaching the detector.

33. The metrology system of claim 26, wherein at least one of the one or more metrology measurements comprises:
an overlay measurement between the first substrate and the second substrate.

34. The metrology system of claim 33, wherein the metrology target comprises:
at least one of an AIM target, an rAIM target, an AIMid target, or a BiB target.

35. The metrology system of claim 34, wherein the illumination from the illumination source comprises:
illumination including one or more wavelengths in an infrared spectral range.

36. The metrology system of claim 26, wherein at least one of the first substrate or the second substrate has a thickness of at least one of 775 μm, 750 μm, 600 μm, 300 μm, or 100 μm.

37. The metrology system of claim 26, wherein at least one of the first substrate or the second substrate comprises:
a semiconductor wafer.

38. A metrology system comprising:
an imaging sub-system configured to image a metrology target buried in a sample on a detector based on light collected from an objective lens, wherein the sample is formed from a first substrate and a second substrate bonded to the first substrate at an interface, the sample further including the metrology target located at the interface, wherein the metrology target includes a first target structure on the first substrate and a second target structure on the second substrate;
a sample positioning sub-system including a translation stage to position the metrology target at a measurement plane of the detector;
an illumination sub-system comprising:
an illumination source;
one or more illumination optics configured to illuminate the metrology target with illumination from the illumination source through the objective lens; and
an illumination field stop located at a field plane conjugate to the metrology target, wherein the illumination field stop includes a field-stop aperture, wherein at least one of a size or shape of the field-stop aperture is selected to provide that a projected size of the field-stop aperture on the measurement plane corresponding to the metrology target matches a field of view of the detector at the measurement plane; and
a controller communicatively coupled to the detector, wherein the controller includes one or more processors configured to execute program instructions causing the one or more processors to:
receive one or more images of the metrology target from the sample; and
generate one or more metrology measurements of the sample based on the one or more images.

39. The metrology system of claim 38, wherein the sample positioning sub-system further comprises:
a beamsplitter configured to split sample-positioning illumination from the illumination source into a measurement arm and a reference arm, wherein the measurement arm includes the objective lens configured to direct the sample-positioning illumination to the sample, wherein the reference arm includes a reference objective lens configured to direct the sample-positioning illumination to a reference sample; and
a photodiode configured to receive light from the beamsplitter associated with interference of light in the measurement arm with light from the reference arm, wherein the photodiode generates sample positioning data.

40. The metrology system of claim 39, wherein the sample-positioning illumination includes the illumination from the illumination source.

41. The metrology system of claim 39, wherein the sample-positioning illumination includes the illumination from an additional illumination source.

42. The metrology system of claim 39, wherein the reference sample is formed from one or more reference substrates.

43. The metrology system of claim 42, wherein the reference sample further comprises:
 a reflective layer on at least one of a back surface or an interface between two reference substrates.

44. The metrology system of claim 38, wherein at least one of the one or more metrology measurements comprises:
 an overlay measurement between the first substrate and the second substrate.

45. The metrology method of claim 44, wherein the metrology target comprises:
 at least one of an AIM target, an rAIM target, an AIMid target, or a BiB target.

46. The metrology system of claim 45, wherein the illumination from the illumination source comprises:
 illumination including one or more wavelengths in an infrared spectral range.

47. The metrology system of claim 38, wherein at least one of the first substrate or the second substrate has a thickness of at least one of 775 μm, 750 μm, 600 μm, 300 μm, or 100 μm.

48. The metrology system of claim 38, wherein at least one of the first substrate or the second substrate comprises:
 a semiconductor wafer.

49. A metrology method comprising:
 illuminating a metrology target on a sample with an illumination sub-system, wherein the sample is formed from a first substrate and a second substrate bonded to the first substrate at an interface, the sample further including a metrology target located at the interface, wherein the metrology target includes a first target structure on the first substrate and a second target structure on the second substrate, wherein the illumination sub-system comprises:
 an illumination source;
 one or more illumination optics configured to illuminate the metrology target with illumination from the illumination source;
 an illumination field stop located at a field plane conjugate to the metrology target, wherein the illumination field stop includes a field-stop aperture, wherein at least one of a size or shape of the field-stop aperture is selected to provide that a projected size of the field-stop aperture on a measurement plane corresponding to the metrology target matches a field of view of an imaging detector at the measurement plane; and
 an illumination pupil located at a pupil plane, wherein the illumination pupil includes a central obscuration in a center of the pupil plane, wherein at least one of a size or shape of the central obscuration is selected to provide oblique illumination of the metrology target with angles greater than a cutoff angle, wherein the cutoff angle is selected based on at least a size of the field of view of the detector at the measurement plane, a thickness of the first substrate, or a thickness of the second substrate, to prevent reflections of the illumination from the illumination source off of at least one of a top surface or a bottom surface of the sample from reaching the detector;
 generating one or more images of the metrology target on the imaging detector; and
 generating one or more metrology measurements of the sample based on the one or more images.

50. The metrology method of claim 49, wherein generating one or more metrology measurements of the sample based on the one or more images comprises:
 generating an overlay measurement between the first substrate and the second substrate based on the one or more images.

51. The metrology system of claim 50, wherein the metrology target comprises:
 at least one of an AIM target, an rAIM target, an AIMid target, or a BiB target.

52. The metrology method of claim 51, wherein illuminating the metrology target on the sample with the illumination sub-system comprises:
 illuminating the metrology target on the sample with illumination from the illumination sub-system including one or more wavelengths in an infrared spectral range.

\* \* \* \* \*